(12) United States Patent
Ge et al.

(10) Patent No.: US 9,658,986 B2
(45) Date of Patent: May 23, 2017

(54) ADVANCED COMPUTATIONAL PROCESSES AND METHODS OF USING THE SAME

(71) Applicant: FUJITSU LIMITED, Kawasaki-shi, Kanagawa (JP)

(72) Inventors: Yi Ge, Bunkyo (JP); Noboru Kobayashi, Tokorozawa (JP); Hiroshi Hatano, Kawasaki (JP); Yasuhiro Oyama, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 588 days.

(21) Appl. No.: 14/167,253

(22) Filed: Jan. 29, 2014

(65) Prior Publication Data

US 2014/0237010 A1  Aug. 21, 2014

(30) Foreign Application Priority Data

Feb. 18, 2013 (JP) .................... 2013-029464
Dec. 12, 2013 (JP) .................... 2013-257371

(51) Int. Cl.
 *H03M 7/24*  (2006.01)
 *G06F 17/16* (2006.01)
 *G06F 9/30*  (2006.01)

(52) U.S. Cl.
 CPC .......... *G06F 17/16* (2013.01); *G06F 9/30014* (2013.01); *G06F 9/30032* (2013.01); *G06F 9/30036* (2013.01); *H03M 7/24* (2013.01)

(58) Field of Classification Search
 CPC ........ G06F 17/16; G06F 9/30036; G06F 5/01; G06F 5/012; G06F 2205/003; H03M 7/24

USPC ................. 708/204, 205, 208, 209
See application file for complete search history.

(56) References Cited

U.S. PATENT DOCUMENTS

| | | | |
|---|---|---|---|
| 2007/0074009 A1 | 3/2007 | Donofrio et al. | |
| 2009/0292750 A1* | 11/2009 | Reyzin ................ | G06F 7/483 708/209 |
| 2011/0099295 A1* | 4/2011 | Wegener ............... | H03M 7/46 709/247 |
| 2011/0302231 A1* | 12/2011 | Huggett ................ | G06F 7/483 708/208 |
| 2013/0262539 A1* | 10/2013 | Wegener ............... | G06F 7/483 708/204 |

(Continued)

FOREIGN PATENT DOCUMENTS

| | | |
|---|---|---|
| JP | 8-101919    | 4/1996 |
| JP | 2005-31848  | 2/2005 |
| JP | 2009-505301 | 2/2009 |

*Primary Examiner* — Matthew Sandifer
(74) *Attorney, Agent, or Firm* — Staas & Halsey LLP

(57) ABSTRACT

A data processing apparatus includes a computing unit that performs a matrix computation between data streams whose unit data is of a matrix format; a determining unit that for each matrix obtained by the matrix computation by the computing unit, determines based on the value of each element included in the matrix, an exponent value for expressing each element included in the matrix as a floating decimal point value; a converting unit that converts the value of each element into a significand value of the element, according to the exponent value determined by the determining unit; and an output unit that correlates and outputs the exponent value and each matrix after conversion in which the value of each element in the matrix has been converted by the converting unit.

11 Claims, 20 Drawing Sheets

(56) References Cited

U.S. PATENT DOCUMENTS

2013/0262548 A1* 10/2013 Ge .......................... G06F 7/52
708/520

* cited by examiner

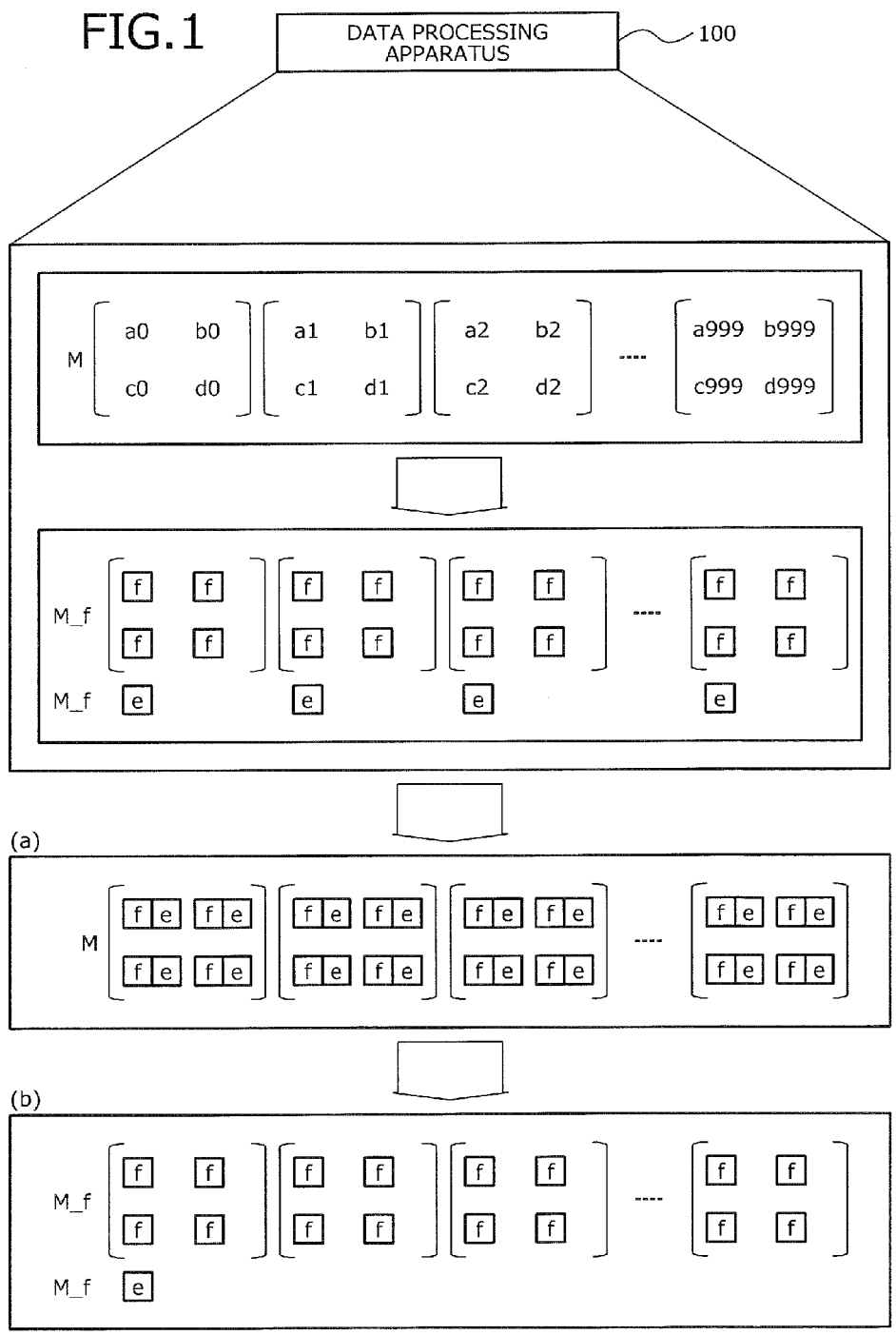

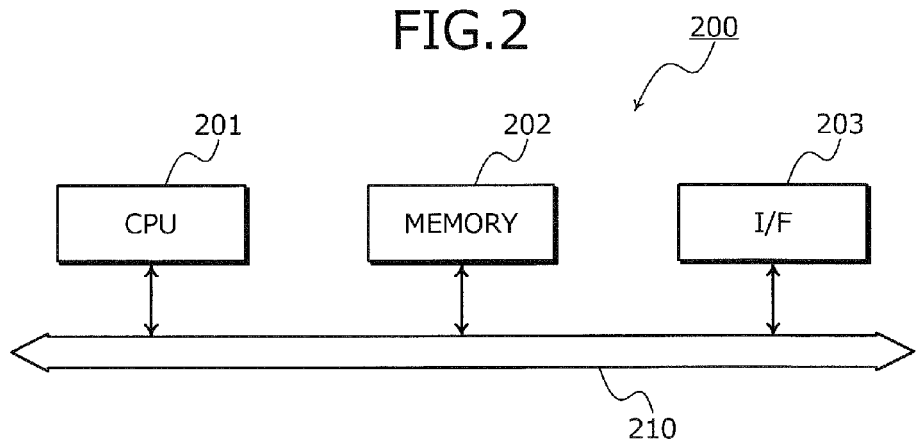
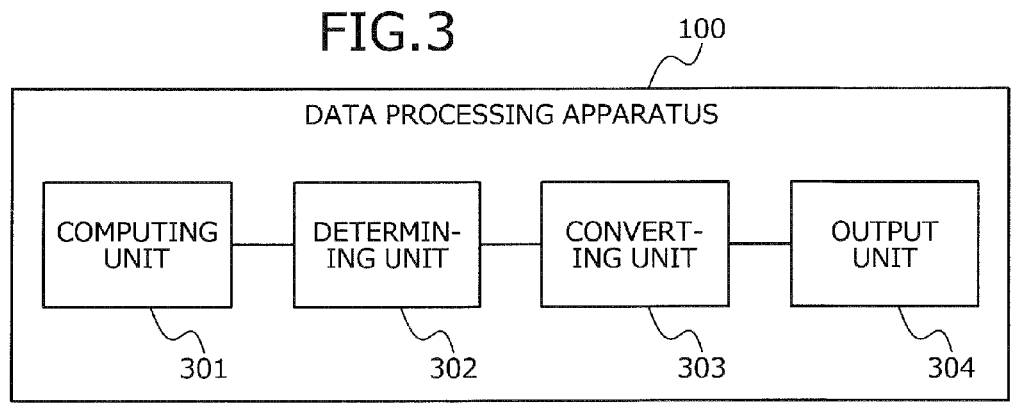

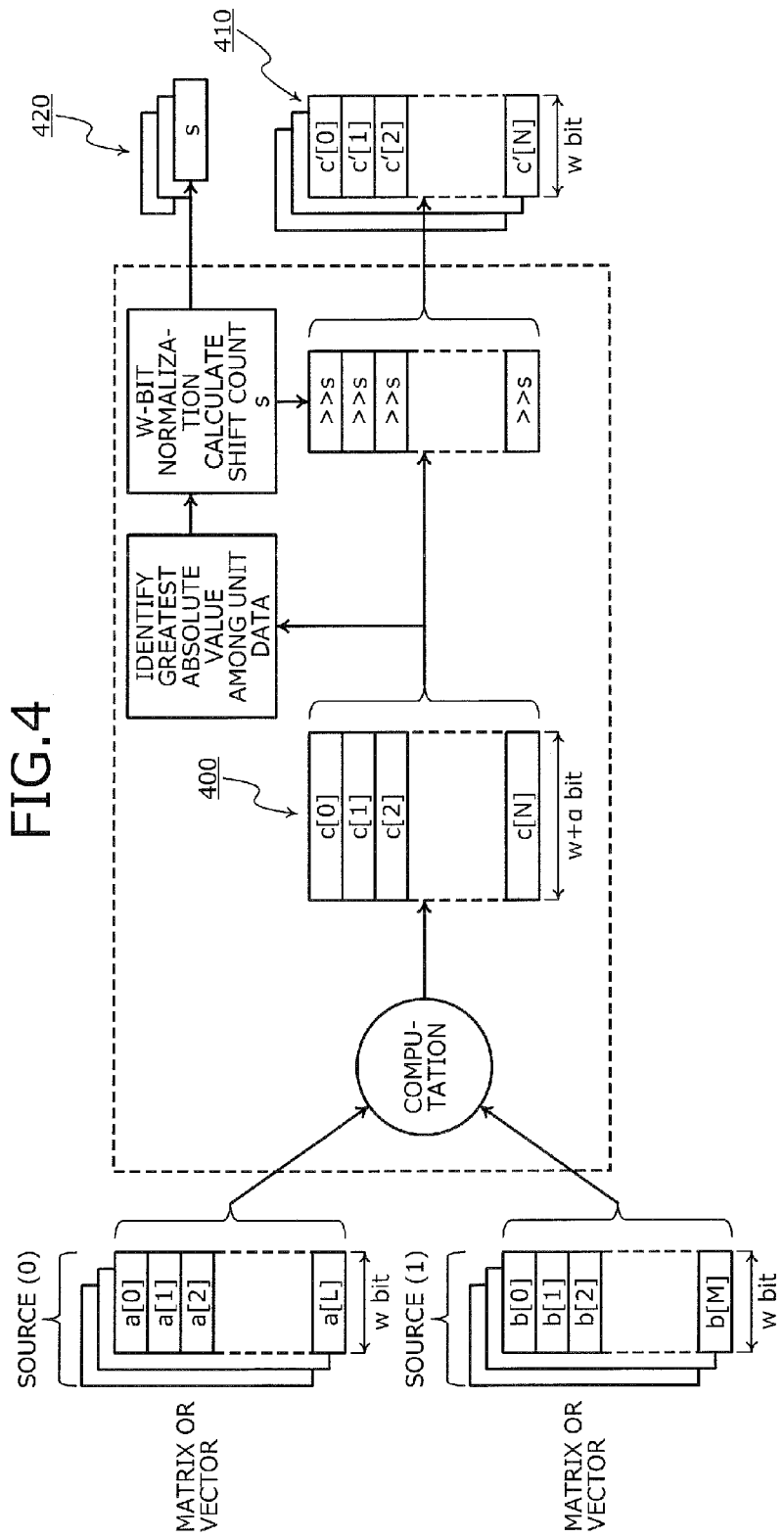

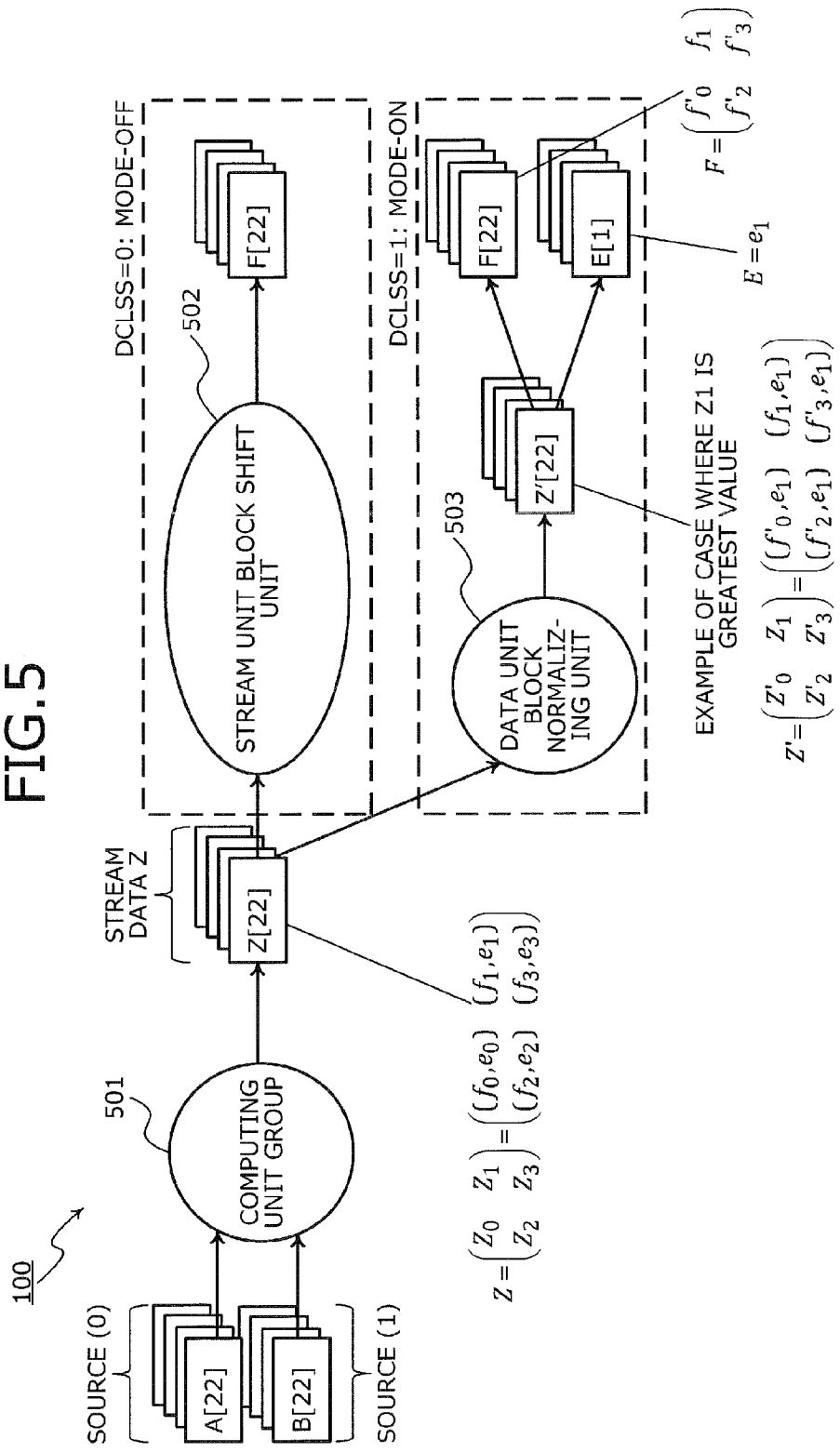

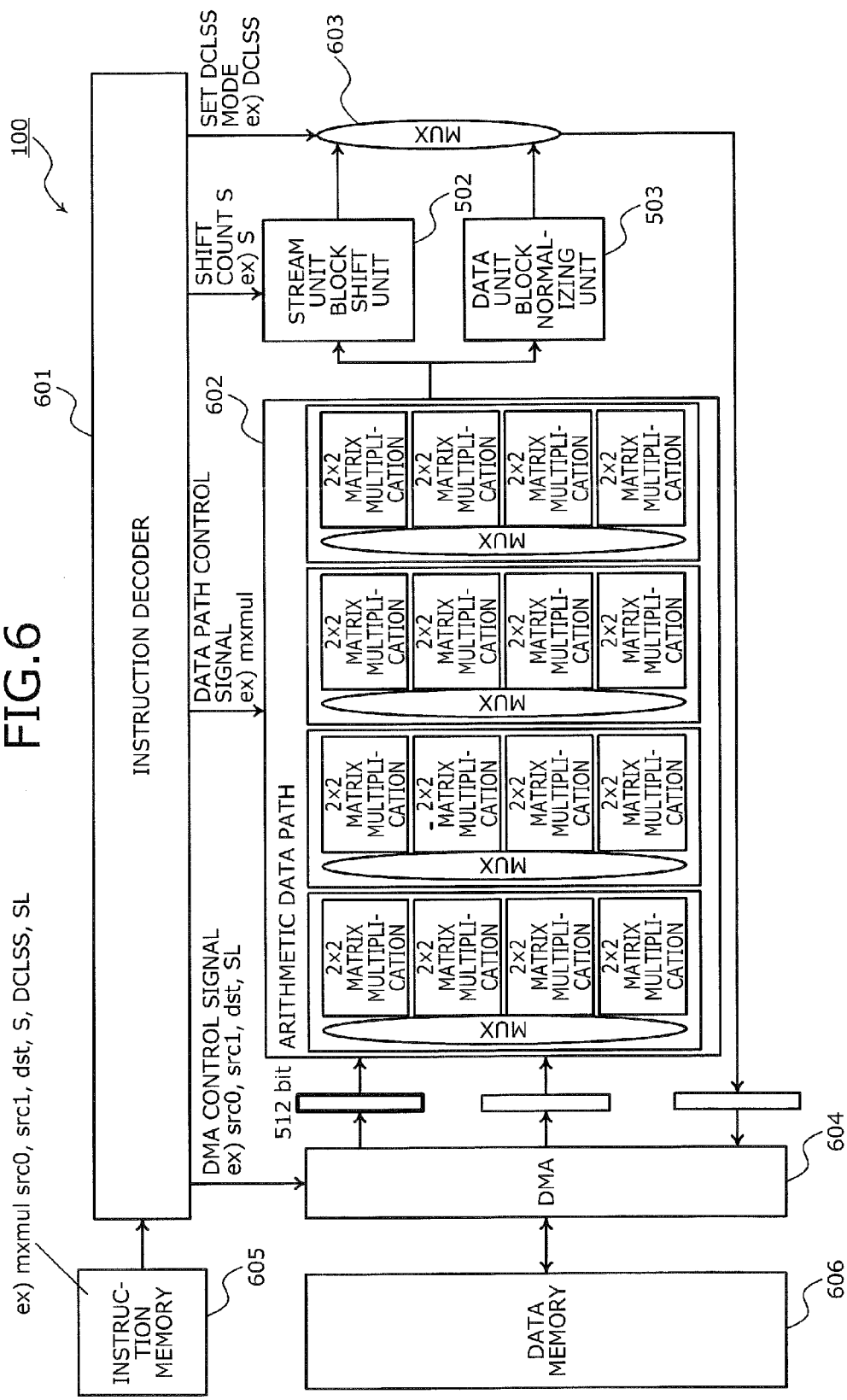

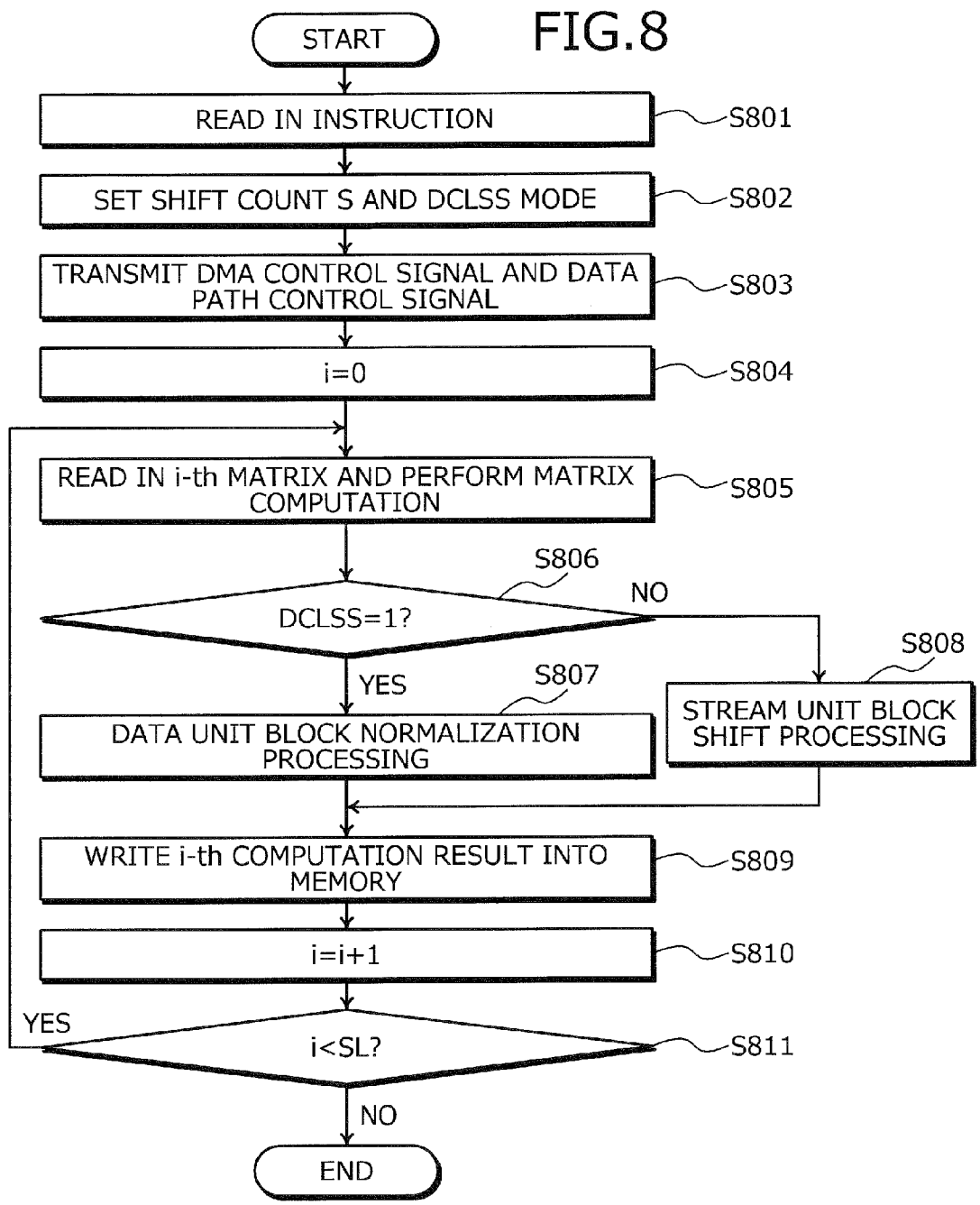

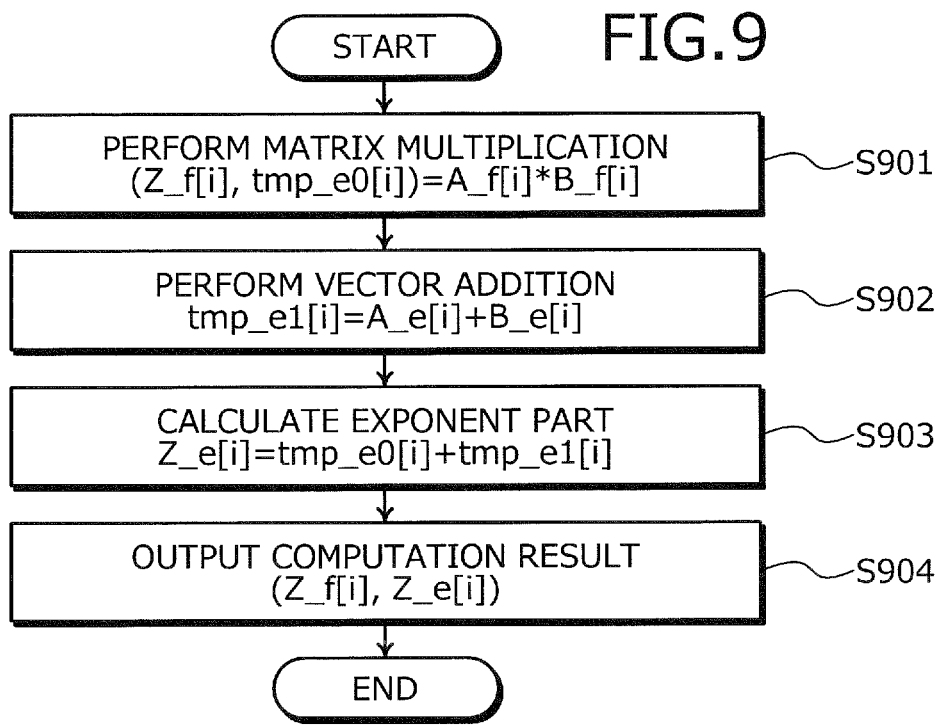

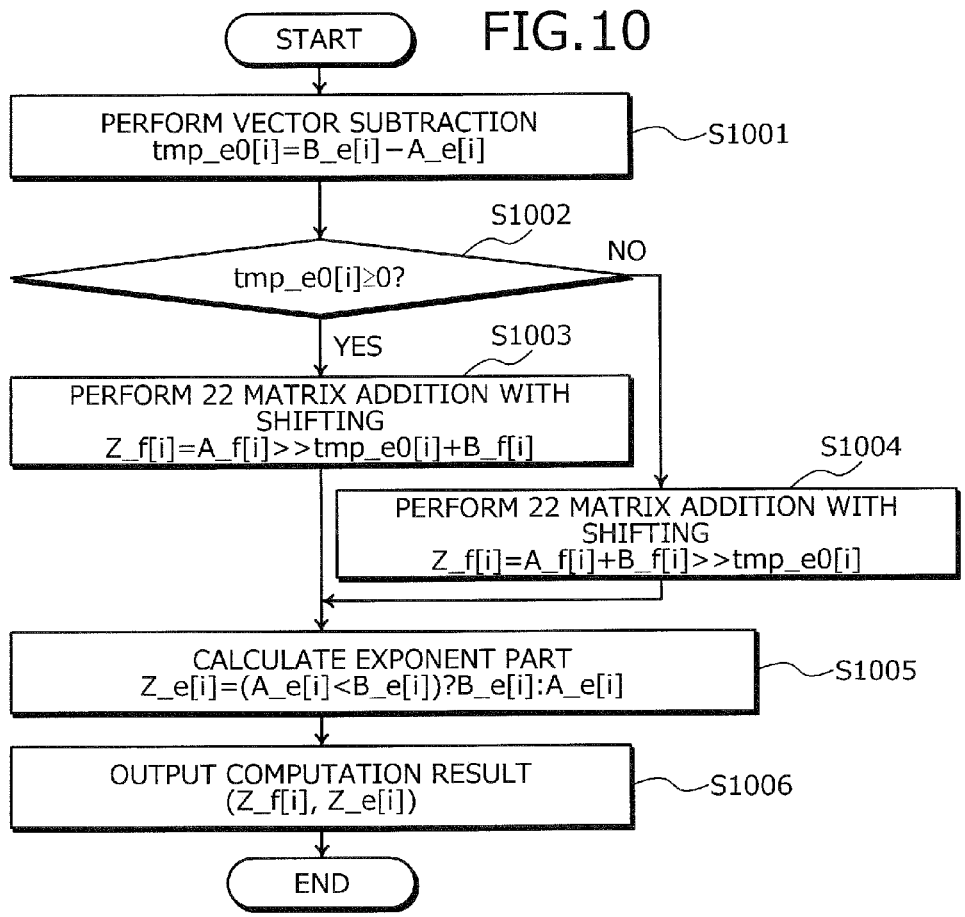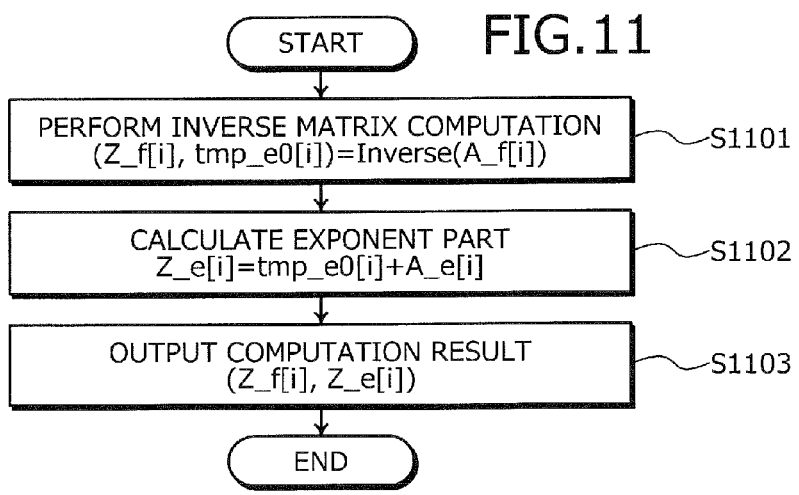

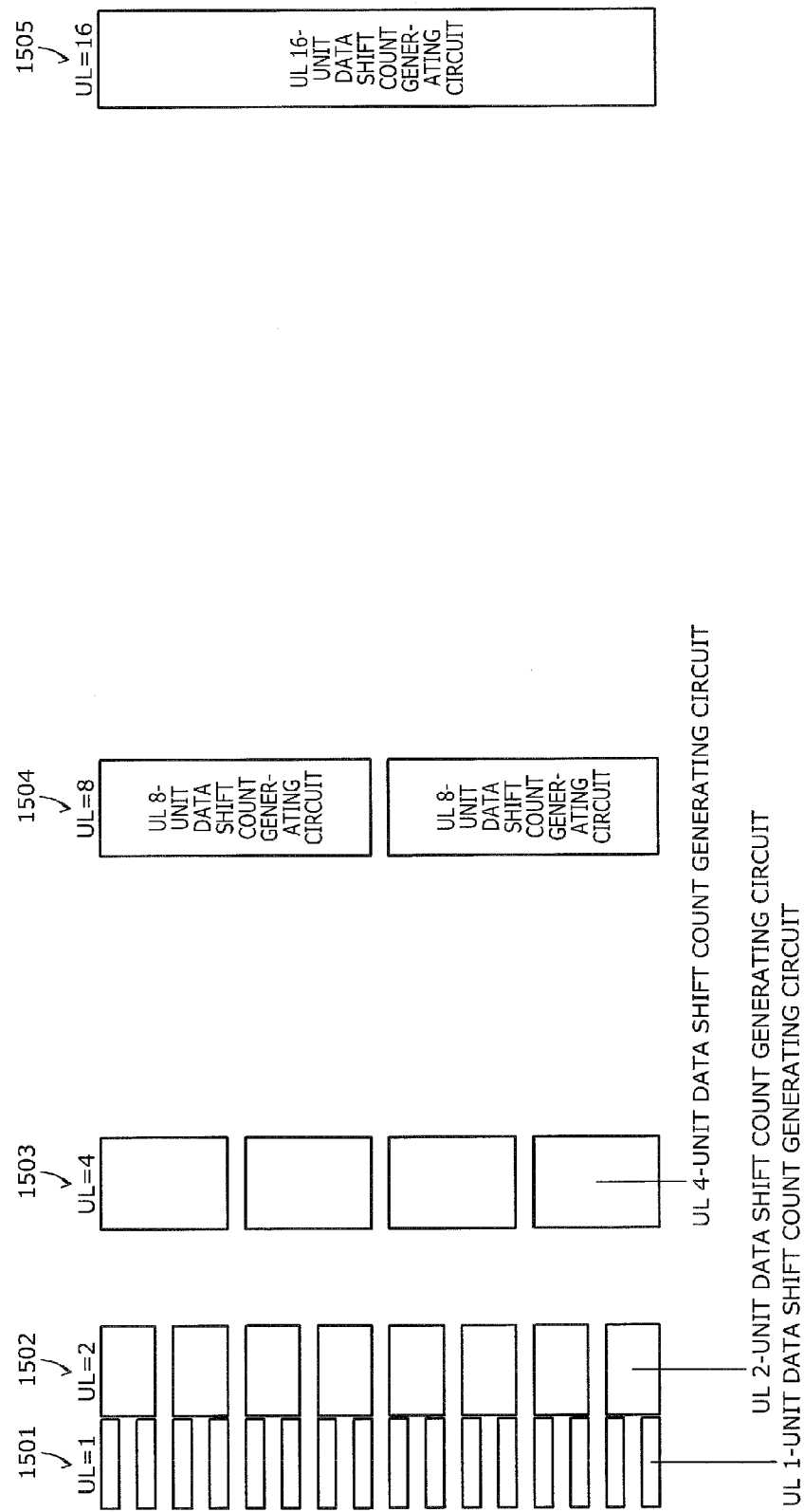

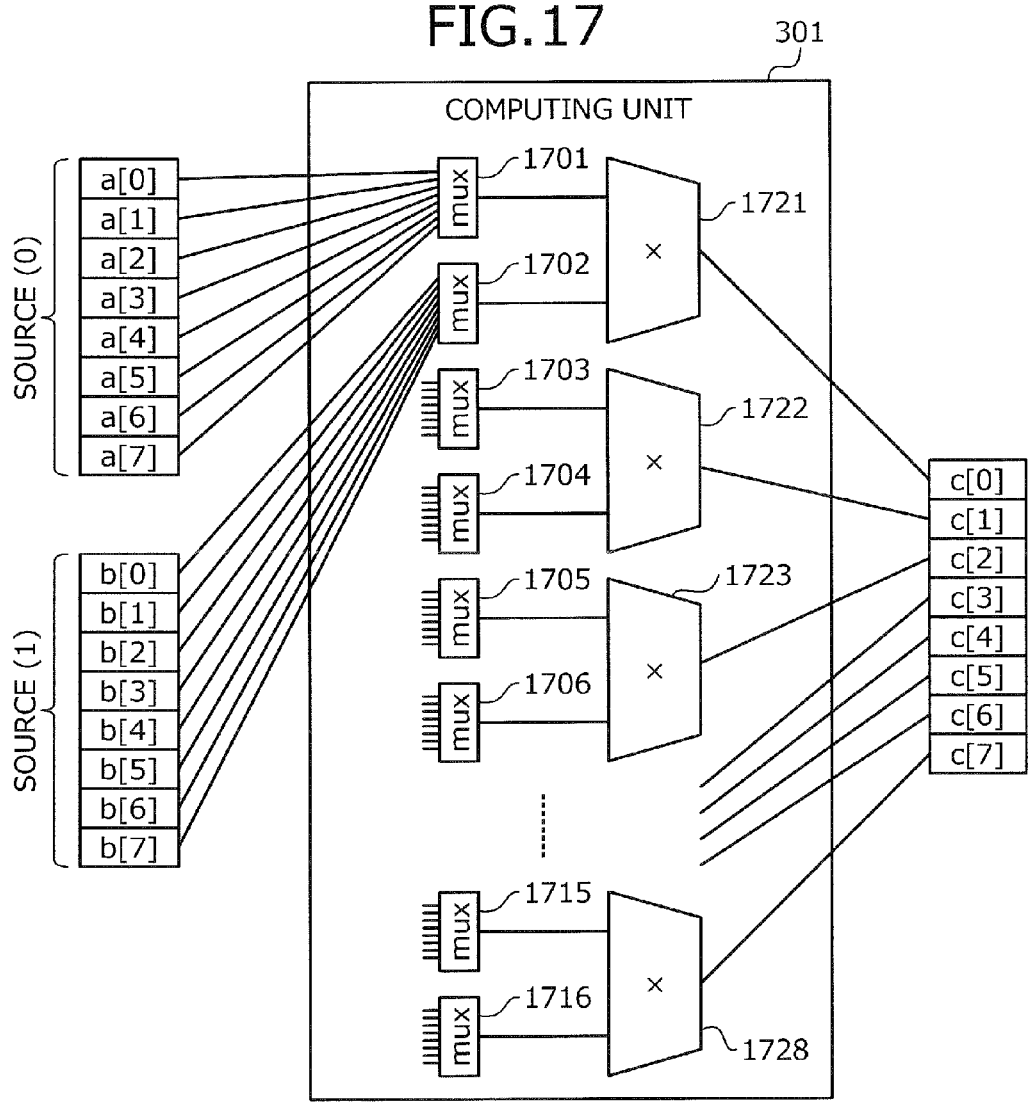

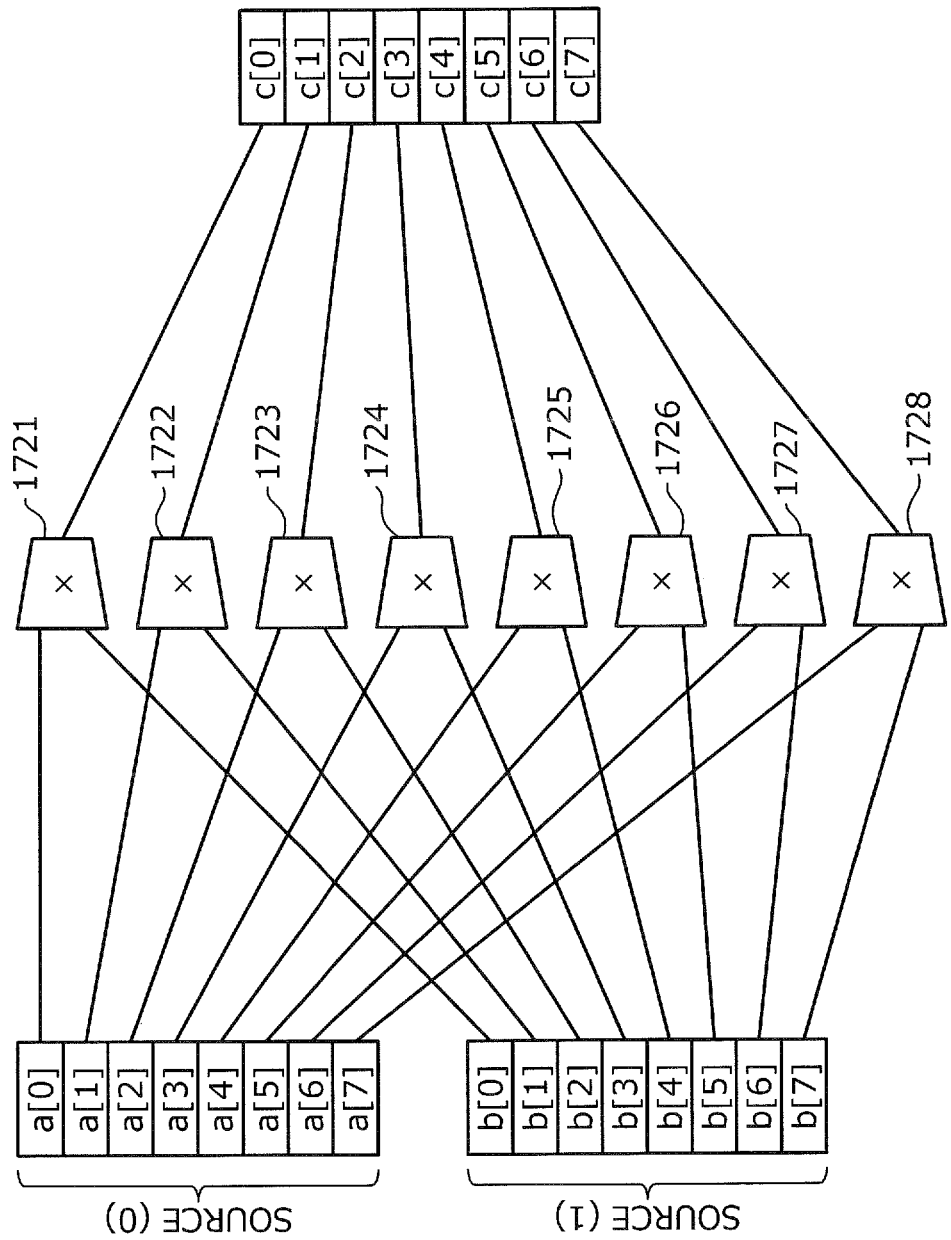

ADVANCED COMPUTATIONAL PROCESSES AND METHODS OF USING THE SAME

CROSS REFERENCE TO RELATED APPLICATIONS

This application is based upon and claims the benefit of priority of the prior Japanese Patent Applications No. 2013-029464, filed on Feb. 18, 2013, and No. 2013-257371, filed on Dec. 12, 2013, the entire contents of which are incorporated herein by reference.

FIELD

The embodiments discussed herein are related to a data processing apparatus, data processing method, and a computer product.

BACKGROUND

A large volume of matrix computation processing can be required in radio communication signal processing, etc. For example, in the long term evolution (LTE)-Advanced as a system of the radio communication signal processing, the matrix computation accounts for much of the overall computation volume. For handling such array-type data that require a large volume of matrix computation processing, an array processing architecture is suitable.

Conventionally, processors that handle array-type data include, for example, single instruction multiple data (SIMD)-system processors and vector-system processors. The array-type data handled by an instruction set of such processors is an array of scalar values and unit data is the scalar value. In an embedded processor, the circuit scale is made smaller by the instruction set handling only integer values.

Related conventional technologies, include, for example, a technology of using only integer arithmetic calculators without using floating-point arithmetic calculators as an arithmetic device and performing a floating decimal point shift calculation. Further, for example, another technology generates floating-point number computation (FP) results obtained by performing calculations with respect to the scalar component of vector input that has been dispatched by a scheduler, by plural FP pipelines, and writes the results to an output buffer. Further, a maximum exponent detecting apparatus detects the maximum exponent of floating decimal point value counts retained in a floating decimal point value register; significand shifting apparatuses shift the significand by a difference of the maximum exponent and each exponent; coding apparatuses perform encoding and perform conversions into integers that retain the relative magnitude of the values. For examples, refer to Japanese Laid-Open Patent Publication Nos. 2005-31848 and H08-101919, and Published Japanese-Translation of PCT Application, Publication No. 2009-505301.

Conventional technologies, however, in the case of instruction sets handling only integer values, have a problem in that, while the circuit area of the processor can be reduced, calculation accuracy may drop. For example, in the case of instruction sets handling only integer values, a multiplication computation, etc. can increase the number of bits required to express each computation result and can bring about a shortage of dynamic range, depending on the application.

SUMMARY

According to an aspect of an embodiment, a data processing apparatus includes a computing unit that performs a matrix computation between data streams whose unit data is of a matrix format; a determining unit that for each matrix obtained by the matrix computation by the computing unit, determines based on the value of each element included in the matrix, an exponent value for expressing each element included in the matrix as a floating decimal point value; a converting unit that converts the value of each element into a significand value of the element, according to the exponent value determined by the determining unit; and an output unit that correlates and outputs the exponent value and each matrix after conversion in which the value of each element in the matrix has been converted by the converting unit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is an explanatory diagram of an example of a data processing method according to a first embodiment;

FIG. 2 is a block diagram of a hardware configuration example of a computer system 200;

FIG. 3 is an explanatory diagram of a functional configuration example of a data processing apparatus 100 according to the first embodiment;

FIG. 4 is an explanatory diagram of one example of processing of a determining unit 302 and a converting unit 303;

FIG. 5 is an explanatory diagram of a circuit configuration example of the data processing apparatus 100;

FIG. 6 is an explanatory diagram of a hardware configuration example of the data processing apparatus 100;

FIG. 8 is a flowchart of one example of data processing of the data processing apparatus 100;

FIG. 9 is a flowchart of one example of specific processing of 22 matrix multiplication;

FIG. 10 is a flowchart of one example of specific processing of 22 matrix addition;

FIG. 11 is a flowchart of one example of specific processing of a 22 inverse matrix computation;

FIGS. 16A and 16B are explanatory diagrams depicting a comparison example of circuit configurations of the shift count generating circuit 1301;

FIG. 17 is an explanatory diagram depicting an example of a circuit configuration of a computing unit 301;

FIG. 18 is an explanatory diagram of a configuration example of a data path (part 1);

DESCRIPTION OF EMBODIMENTS

Figure 7:
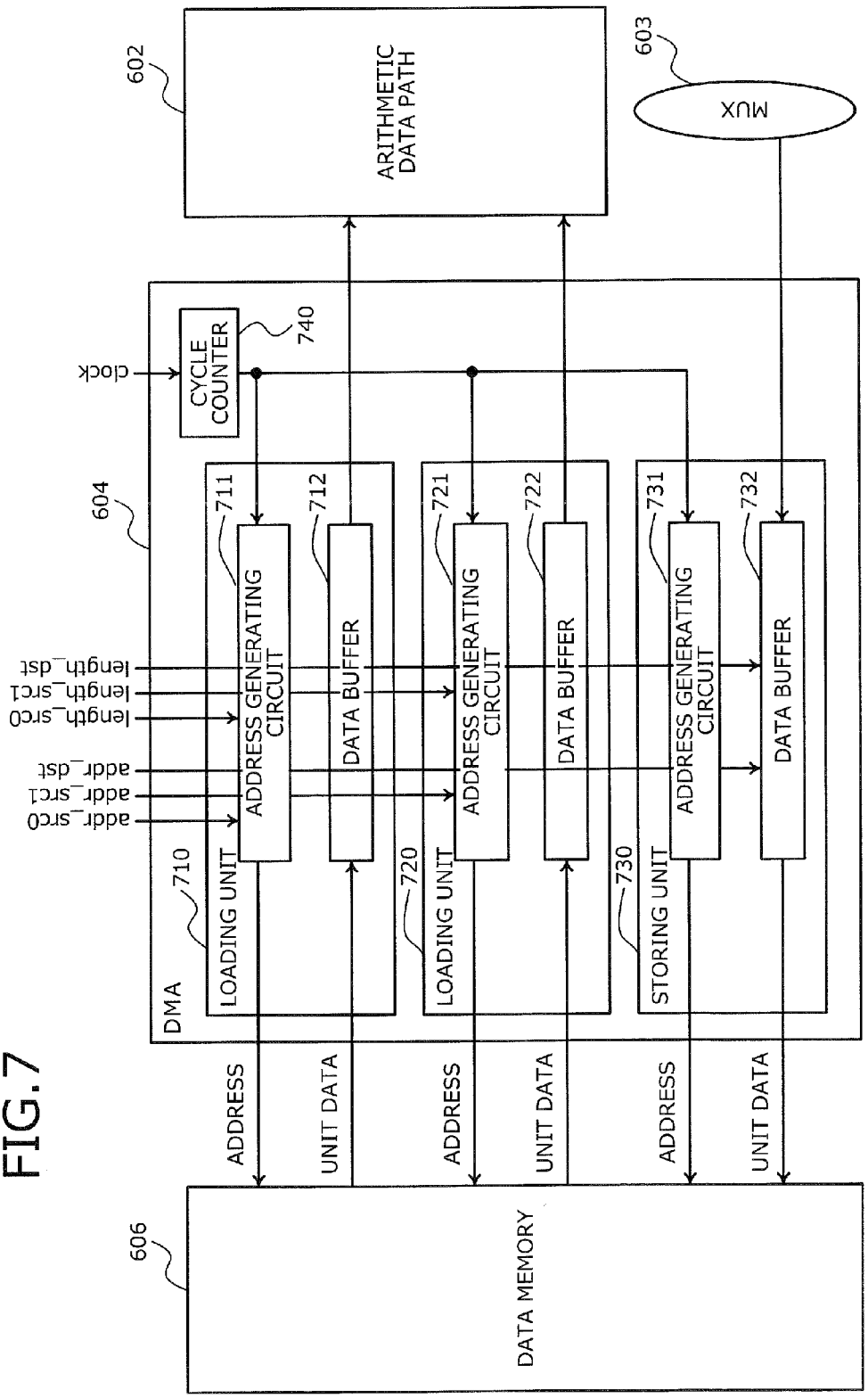
FIG. 7 is an explanatory diagram of an internal configuration example of a DMA 604.

Embodiments of a data processing apparatus, a data processing method, and computer product will be described in detail with reference to the accompanying drawings.

FIG. 1 is an explanatory diagram of an example of a data processing method according to a first embodiment. In FIG. 1, a data processing apparatus 100 is a computer that performs stream-type processing. Stream-type processing is processing of sequentially reading out a series of data (array-type data) from memory, performing computations and sequentially writing a series of computation results to the memory.

The data processing apparatus 100 has, as an instruction set, a group of instructions for handling unit data. Unit data is, for example, matrix-form (or vector-form) data. An instruction is, for example, a multiply instruction, an add instruction, an inverse matrix (divide) instruction, etc.

In radio communication signal processing, etc., a large volume of matrix computation processing can be required. In such a case, an instruction set that handles only integer values can suppress the circuit area of the processor but brings about drops in calculation accuracy. For this reason, array-type data is expressed by a floating decimal point.

For example, a case is assumed in which array M of 1000 data of a 2×2 matrix is expressed by a floating decimal point. In FIG. 1, "f" denotes the value of the significand part in the case of expressing each element included in the matrix in the floating decimal point. In FIG. 1, "e" denotes the value of the exponent part in the case of expressing each element included in the matrix as a floating decimal point value. In the following description, the value of the significand part will occasionally be described as "significand value" and the value of the exponent part will occasionally be described as "exponent value".

In this case, as depicted in (a) of FIG. 1, in the case of treating each value included in array M as a floating decimal point value, while high calculation accuracy can be obtained, the processor is required to support the floating decimal point in the instruction set, making the circuit area large. As depicted in (b) of FIG. 1, in the case of performing the computation after shifting array M as a whole at a time by an integer shift instruction, since the amount of shift is determined by the numerical value whose absolute value is the greatest among array M as a whole, the calculation accuracy may drop for an numerical value whose absolute value is small.

In this first embodiment, the data processing apparatus 100 performs the matrix computation processing of array M by allocating for each matrix included in array M, the exponent part of the matrix unit. This suppresses an increase in the circuit scale as compared with the case of treating each value included in array M as a floating decimal point value and further realizes high calculation accuracy as compared with the case of performing the computation after shifting array M as a whole at a time by an integer shift instruction.

A hardware configuration example will be described of a computer system 200 to which the data processing apparatus 100 is applied. The computer system 200 is, for example, a smartphone, a cell-phone, a tablet personal computer (PC), a personal handy-phone system (PHS), etc.

FIG. 2 is a block diagram of a hardware configuration example of a computer system 200. As depicted in FIG. 2, the computer system 200 includes a central processing unit (CPU) 201, memory 202, and an interface (I/F) 203, respectively connected by a bus 210.

The CPU 201 governs overall control of the computer system 200. The memory 202 includes, for example, read-only memory (ROM), random access memory (RAM), and flash ROM. For example, flash ROM stores programs such as an OS and firmware; ROM stores application programs; and RAM is used as a work area of the CPU 201. Programs stored in the memory 202 are loaded on the CPU 201 and encoded processes are executed by the CPU 201.

The I/F 203 controls the input and output of data with respect to other apparatuses. For example, the I/F 203 is connected via a communication line to a network such as a local area network (LAN), a wide area network (WAN), and the Internet; and through the network is connected to other apparatuses. The I/F 203 administers an internal interface with the network and controls the input and output of data with respect to other apparatuses. In addition to the above components, the computer system 200 may further include a magnetic disk drive, a magnetic disk, a display, a keyboard, a mouse, etc.

A functional configuration example will be described of the data processing apparatus 100 according to the first embodiment. FIG. 3 is an explanatory diagram of a functional configuration example of the data processing apparatus 100 according to the first embodiment. In FIG. 3, the data processing apparatus 100 is configured to include a computing unit 301, a determining unit 302, a converting unit 303, and an output unit 304. For example, each functional unit may be formed by elements such as an AND as a logical AND circuit, an inverter as a negative logic circuit, an OR as a logical OR circuit, a NOR as a logical NOR circuit, and a flip-flop (FF) as a latch circuit. Each functional unit may be implemented by a field programmable gate array (FPGA), with the function being defined by description in, for example, Verilog-hardware description language (HDL), etc., and with the logic synthesis performed of the description. Functions of each functional unit may be implemented, for example, by causing the CPU 201 to execute a program stored in the memory 202 depicted in FIG. 2, or by the I/F 203.

The computing unit 301 performs a matrix computation between data streams D. A data stream D is array-type data whose unit data are of a matrix format. A matrix computation is, for example, matrix multiplication, matrix addition, inverse matrix (matrix division), etc. The value of each element of the matrix included in a data stream D is, for example, the integer value.

In the following description, two data streams D subject to computation will occasionally be described as "source (0)" and "source (1)". In this case, the computing unit 301 sequentially performs the matrix computation of matrices included in source (0) and matrices included in source (1), from the head matrix to the end matrix of each source. It is noted, however, that the number of data streams D subject to computation may be three or more.

For each of the matrices obtained by the matrix computation by the computing unit 301, the determining unit 302 determines, based on the value of each element included in the matrix, the exponent value of the matrix unit in the case of expressing each element as a floating decimal point value. The exponent value is the value of the exponent part in the case of expressing each element as a floating decimal point value. For example, the determining unit 302 may determine, as the exponent value of the matrix unit, the exponent value in the case of expressing, as a floating decimal point value, the element whose absolute value is the greatest among plural elements included in the matrix, for each of the matrices to be obtained by the matrix computation of the computing unit 301.

For example, the determining unit 302 identifies the element whose absolute value is the greatest among plural elements included in the matrix. The determining unit 302 then normalizes the value of the element whose absolute value is the greatest to calculate the significand value and the exponent value. The significand value is the value of the significand part in the case of expressing the element as a floating decimal point value. The determining unit 302 determines the exponent value of the element whose absolute value is the greatest to be the exponent value of the matrix unit. Namely, the determining unit 302 unifies the exponent values in the case of expressing the elements included in the matrix as a floating decimal point value, for each matrix. Specific processing of the determining unit 302 will be described later with reference to FIG. 4.

The converting unit 303 converts the value of each element included in the matrix into the significand value of each element according to the exponent value of the matrix unit determined by the determining unit 302. For example, the converting unit 303 converts the value of each element included in the matrix to the value shifted by the exponent value of the matrix unit (significand value). Specific processing of the converting unit 303 will be described later with reference to FIG. 4.

The output unit 304 correlates and outputs the matrix after the conversion in which the value of each element has been converted by the converting unit 303, and the exponent value of the matrix unit determined by the determining unit 302. For example, for each of the matrices to be obtained by the matrix computation of the computing unit 301, the output unit 304 correlates and sequentially writes to memory (e.g., a data memory 606 depicted in FIG. 6 to be described later), the matrix after the conversion in which the value of each element included in the matrix has been converted, and the exponent value of the matrix unit.

Thus, the array of the matrices after the conversion in which the value of each element included in the matrix has been converted by the converting unit 303 (hereinafter, occasionally described as "significand part stream") and the array of the exponent values of the matrix unit determined by the determining unit 302 (hereinafter, occasionally described as "exponent part stream") are output.

The computing unit 301 may perform the matrix computation of the data stream D including the significand part stream and the exponent part stream output by the output unit 304. For example, in the case of performing the matrix multiplication computation between two data streams D, the computing unit 301 performs the matrix multiplication of two significand part streams and performs vector addition of two exponent part streams.

In the case of performing the matrix addition computation between two data streams D, the computing unit 301 performs the matrix addition computation between two data streams D by shifting the value of each element included in one of the corresponding matrices between the two data streams D, based on a difference of corresponding exponent values between the two data streams D. Thus, it becomes possible to cause the exponent values of the matrices subject computation to match. Specific processing of the computing unit 301 at the time of performing the matrix computation of stream data D that includes the significand part stream and the exponent part stream will be described later.

The converting unit 303 may convert the value of each element included in the matrix to the significand value of each element according to the exponent value of each data stream D unit. The exponent value for the data stream D unit is arbitrarily settable, for example, as an immediate source operand of an instruction.

For example, the converting unit 303 converts the value of each element included in the matrix into the value shifted by the exponent value of the data stream D unit. In this case, the output unit 304 may correlate and output the matrix after the conversion in which the value of each element included in the matrix has been converted by the converting unit 303, and the exponent value of the data stream D unit. In the following description, the exponent value of the data stream D unit will occasionally be described as "shift count S".

Specific processing of the determining unit 302 and the converting unit 303 of the data processing apparatus according to the first embodiment will be described. FIG. 4 is an explanatory diagram of one example of processing of the determining unit 302 and the converting unit 303. In FIG. 4, source (0) is the array-type data whose unit data is of the matrix format. a[0] to a[L] are values of the elements of the matrix included in source (0). For example, in the case of a 2×2 matrix, a[0] denotes the value of the first row and first column, a[1] the first row and second column, a[2] the second row and first column, and a[3] the second row and second column.

Source (1) is array-type data whose unit data is of the matrix format. b[0] to b[M] are values of the elements of the matrix included in source (1). The value of each of a[0] to a[L] and b[0] to b[M] is the integer value of w bits (e.g., w=16).

A computation result 400 is a matrix representing the result of the matrix computation of the matrix included in source (0) and the matrix included in source (1). c[0] to c[N] are the values of the elements included in the computation result 400. The value of each of C[0] to c[N] is the integer value of (w+α) bits (e.g., α=17, 18). A correspondence relationship of the computation of the elements due to differences of L, M, and N is determined by the kind of instruction. For example, in the case of the matrix multiplication instruction, if source (0) is a 2×2 matrix and source (1) is a 2×1 matrix, L, M, and N are 3, 1, and 1, respectively and c[1] becomes c[1]=a[2]×b[0]+a[3]×b[1].

In this case, the determining unit 302 identifies the element whose absolute value is the greatest among plural elements included in the computation result 400. The determining unit 302 then normalizes the value of the element whose absolute value is the greatest to calculate the significand value and the exponent value. The determining unit 302 determines, as the exponent value of the matrix unit, the exponent value of the element whose absolute value is the greatest. In the following description, the exponent value of the matrix unit will occasionally be described as "shift count s".

The converting unit 303 performs a computation for shifting the value of each element included in the computation result 400 by shift count s determined by the determining unit 302 and calculates the significand values c'[0] to c'[N] of the elements. The value of each of c'[0] to c'[N] is the integer value of w bits. The converting unit 303 converts the values of the elements included in the computation result 400 to the calculated significand values c'[0] to c'[N] of the elements.

In the following description, in the case of expressing each element included in the matrix as a floating decimal point value, processing of determining the exponent value of the matrix unit and converting the value of each element to the significand values corresponding to the exponent value of the matrix unit will occasionally be described as "data unit block normalization processing".

The output unit 304 correlates and outputs the computation result 400 after the conversion including the significand values c'[0] to c'[N] of the elements, and shift count s. Thus, by performing the data unit block normalization processing for each of the matrices as the result of the computation of the matrices included in source (0) and the matrices included in source (1), the significand part stream 410 and the exponent part stream 420 can be output.

FIG. 5 is an explanatory diagram of a circuit configuration example of the data processing apparatus 100. In FIG. 5, the data processing apparatus 100 has an computing device group 501, a stream unit block shift unit 502, and a data unit block normalizing unit 503. The computing device group 501 performs the matrix computation of source (0) and source (1). Stream data Z is an array that results from the matrix computation between source (0) and source (1). The computing device group 501 corresponds to, for example, the computing unit 301 depicted in FIG. 3.

The data processing apparatus 100 has two modes, including a DCLSS mode-on and a DCLSS mode-off. The DCLSS mode-on is the mode at which the integer stream is input and the significand part stream and the exponent part stream are output. The DCLSS mode-off is the mode at which the integer stream is input and the integer stream is output.

A user can arbitrarily select any one among the DCLSS mode-on and the DCLSS mode-off. For example, in the case of performing the matrix multiplication or the matrix division between two data streams D, since it is highly likely that the number of bits required for expressing the computation result will increase once, the user selects the DCLSS mode-on. In the case of performing the matrix addition between two data streams D, since it is unlikely that the number of bits required for expressing the computation result will increase once, the user selects the DCLSS mode-off.

For example, when the DCLSS mode-off is selected, the stream unit block shift unit 502 performs the computation of shifting the value of each element included in matrix Z[22] by shift count S, for each matrix Z[22] included in the stream data Z. The [22] denotes two rows by two columns. The stream unit block shift unit 502 then converts the value of each element included in matrix Z[22] to the 16-bit integer value. Matrix Z[22] after conversion to the 16-bit integer value is described as matrix F[22]. The stream unit block shift unit 502 corresponds to, for example, the converting unit 303 depicted in FIG. 3.

In the following description, processing of shifting the value of each element included in the matrix by the shift count S and converting the value of each element included in the matrix to the 16-bit integer value will occasionally be described as "stream unit block shift processing".

When the DCLSS mode-on is selected, the data unit block normalizing unit 503 performs the data unit block normalization processing for each matrix Z[22] included in the stream data Z. The data unit block normalizing unit 503 corresponds to, for example, the determining unit 302 and the converting unit 303 depicted in FIG. 3.

If the elements included in matrix Z[22] are given as "elements $Z_0$ to $Z_3$", the significand values of the elements $Z_0$ to $Z_3$ are given as "significand values $f_0$ to $f_3$", and the exponent values of the elements $Z_0$ to $Z_3$ are given as "exponent values $e_0$ to $e_3$", then matrix Z[22] can be expressed, for example, by equation (1).

$$Z = \begin{pmatrix} Z_0 & Z_1 \\ Z_2 & Z_3 \end{pmatrix} = \begin{pmatrix} (f_0, e_0) & (f_1, e_1) \\ (f_2, e_2) & (f_3, e_3) \end{pmatrix} \quad (1)$$

If it is assumed that the element whose absolute value is the greatest among the elements $Z_0$ to $Z_3$ included in matrix Z[22] is "element $Z_1$" and if the exponent parts of all elements $Z_0$ to $Z_3$ included in matrix Z[22] are unified by "exponent value $e_1$", then matrix Z[22] becomes as indicated by equation (2).

$$Z' = \begin{pmatrix} Z'_0 & Z'_1 \\ Z'_2 & Z'_3 \end{pmatrix} = \begin{pmatrix} (f'_0, e_1) & (f'_1, e_1) \\ (f'_2, e_1) & (f'_3, e_1) \end{pmatrix} \quad (2)$$

Matrix F[22] after the conversion in which the values of the elements $Z'_0$, $Z'_1$, $Z'_2$, and $Z'_3$ included in matrix Z'[22] have been converted to the significand, values corresponding to the exponent value $e_1$ becomes as indicated by equation (3). Exponent value E of the matrix unit corresponding to matrix F[22] becomes as indicated by equation (4).

$$F = \begin{pmatrix} f'_0 & f'_1 \\ f'_2 & f'_3 \end{pmatrix} \quad (3)$$

$$E = e_1 \quad (4)$$

For example, it is assumed that the values of the elements $Z_0$ to $Z_3$ included in matrix Z[22] are 32-bit integer values as indicated below.
$Z_0$=0x00134cff
$Z_1$=0x12a84cff
$Z_2$=0x39c34cff
$Z_3$=0x0b054cff In this case, since the absolute value of element $Z_2$ is the greatest among elements $Z_0$ to $Z_3$, the significand value f and the exponent value e of elements $Z'_0$ to $Z'_3$ included in matrix Z'[22] are as follows.
$Z'_0$:f=0x0026, e=15
$Z'_1$:f=0x2550, e=15
$Z'_2$:f=0x7386, e=15
$Z'_3$:f=0x160a, e=15

Specific processing of the computing unit 301 at the time of performing the matrix computation of the stream data D including the significand part stream and the exponent part stream will be described.

In the following description, the significand part stream of source (0) will occasionally be described as "significand part stream (0)" and the exponent part stream of source (0) will occasionally be described as "exponent part stream (0)". The significand part stream of source (1) will occasionally be described as "significand part stream (1)" and the exponent part stream of source (1) will occasionally be described as "exponent part stream (1)".

Specific processing of the 22 matrix multiplication, with allocation of the exponent value of the matrix unit, between source (0) and source (1) will be described. In this case, the computing unit 301 performs the matrix multiplication of the significand part stream (0) and the significand part stream (1), using equation (5), where A_f[i] is i-th data (matrix) included in the significand part stream (0) and B_f[i] is the i-th data (matrix) included in the significand part stream (1) (i=0, 1, 2, . . . , SL-1). SL is the stream length of source (0) and source (1). (Z_f[i],tmp_e0[i]) is the i-th computation result, Z_f[i] is the computation result (2 2 matrix) of the significand part, and tmp_e0[i] is the computation result (scalar value) of the exponent part.

$$(Z\_f[i], tmp\_e0[i]) = A\_f[i] * B\_f[i] \tag{5}$$

For example, the computing unit 301 initializes "i" to be "i=0" and performs the matrix multiplication between the significand part streams, using equation (5) above. The computing unit 301 then increments "i" and determines whether "i" is less than the stream length SL. If "i" is less than the stream length SL, then the computing unit 301 performs the matrix multiplication between the significand part streams, using equation (5) above. On the other hand, if "i" is greater than or equal to the stream length SL, then the computing unit 301 completes the matrix multiplication between the significand part streams.

The computing unit 301 performs the vector addition of the exponent part stream (0) and the exponent part stream (1), using equation (6), where A_e[i] is the i-th data included in the exponent part stream (0) and B_e[i] is the i-th data included in the exponent part stream (1). tmp_e1[i] is the i-th computation result.

$$tmp\_e1[i] = A\_e[i] + B\_e[i] \tag{6}$$

For example, the computing unit 301 initializes "i" to be "i=0" and performs the vector addition between the exponent part streams, using equation (6) above. The computing unit 301 then increments "i" and determines whether "i" is less than the stream length SL. If "i" is less than the stream length SL, then the computing unit 301 performs vector addition between the exponent part streams, using equation (6) above. On the other hand, if "i" is greater than or equal to the stream length SL, then the computing unit 301 completes the vector addition between the exponent part streams.

The computing unit 301 then calculates the i-th computation result of the exponent part of the 2 2 matrix multiplication of source (0) and source (1), using the following equation (7).

$$Z\_e[i] = tmp\_e0[i] + tmp\_e1[i] \tag{7}$$

For example, the computing unit 301 initializes "i" to be "i=0" and calculates the i-th computation result of the exponent part, using equation (7) above. The computing unit 301 then increments "i" and determines whether "i" is less than the stream length SL. If "i" is less than the stream length SL, then the computing unit 301 calculates the i-th computation result of the exponent part, using equation (7) above. On the other hand, if "i" is greater than or equal to the stream length SL, then the computing unit 301 completes the computation of the exponent part. As a result, the i-th computation result of the 2 2 matrix multiplication of source (0) and source (1) becomes (Z_f[i],Z_e[i]).

Specific processing will be described of the 2 2 matrix addition, with allocation of the exponent value of the matrix unit, between source (0) and source (1). In this case, the computing unit 301 performs vector subtraction of the exponent part stream (0) and the exponent part stream (1), using equation (8), where tmp_e0[i] is the i-th computation result.

$$tmp\_e0[i] = B\_e[i] - A\_e[i] \tag{8}$$

For example, the computing unit 301 initializes "i" to be "i=0" and performs the vector subtraction between the exponent part streams, using equation (8) above. The computing unit 301 then increments "i" and determines whether "i" is less than the stream length SL. If "i" is less than the stream length SL, then the computing unit 301 performs the vector subtraction between the exponent part streams, using equation (8) above. On the other hand, if "i" is greater than or equal to the stream length SL, then the computing unit 301 completes the vector subtraction between the exponent part streams.

If tmp_e0[i] is greater than or equal to 0, the computing unit 301 performs the 2 2 matrix addition with shifting, using equation (9), where A_f[i]>>tmp_e0[i] denotes right shifting of A_f[i] by tmp_e0[i].

$$Z\_f[i] = A\_f[i] >> tmp\_e0[i] + B\_f[i] \tag{9}$$

On the other hand, if tmp_e0[i] is not greater than or equal to 0, the computing unit 301 performs the 2 2 matrix addition with shifting, using equation (10), where B_f[i]>>tmp_e0[i] denotes the right shifting of B_f[i] by tmp_e0[i].

$$Z\_f[i] = A\_f[i] + B\_f[i] >> tmp\_e0[i] \tag{10}$$

For example, the computing unit 301 initializes "i" to be "i=0" and performs the 2 2 matrix addition with shifting, using equation (9) or (10) above. The computing unit 301 then increments "i" and determines whether "i" is less than the stream length SL. If "i" is less than the stream length SL, then the computing unit 301 performs the 2 2 matrix addition with shifting, using equation (9) or (10) above. On the other hand, if "i" is greater than or equal to the stream length SL, then the computing unit 301 completes the 2 2 matrix addition with shifting.

The computing unit 301 calculates the i-th computation result of the exponent part of the 2 2 matrix addition between source (0) and source (1), using equation (11). Equation (11) is a function that becomes "Z_e[i]=B_e[i]" if A_e[i]<B_e[i] and becomes "Z_e[i]=A_e[i]" if A_e[i] B_e[i].

$$Z\_e[i] = (A\_e[i] < B\_e[i]) ? B\_e[i] : A\_e[i] \tag{11}$$

For example, the computing unit 301 initializes "i" to be "i=0" and calculates the i-th computation result of the exponent part, using equation (11) above. The computing unit 301 then increments "i" and determines whether "i" is less than the stream length SL. If "i" is less than the stream length SL, then the computing unit 301 calculates the i-th computation result of the exponent part, using the above equation (11). On the other hand, if "i" is greater than or equal to the stream length SL, then the computing unit 301 completes the computation of the exponent part. As a result, the i-th computation result of the 2 2 matrix addition of source (0) and source (1) becomes (Z_f[i],Z_e[i]).

Specific processing for the 2 2 inverse matrix computation with the assignment of the exponent value of the matrix unit in source (0) will be described. The computing unit 301 performs the inverse matrix computation for the i-th data included in the significand part stream (0), using equation (12).

$$(Z\_f[i], tmp\_e0[i]) = \text{Inverse}(A\_f[i]) \tag{12}$$

For example, the computing unit 301 initializes "i" to be "i=0" and performs the inverse matrix computation of the i-th data, using equation (12) above. The computing unit 301 then increments "i" and determines whether "i" is less than the stream length SL. If "i" is less than the stream length SL, then the computing unit 301 performs the inverse matrix computation of the i-th data, using equation (12) above. On the other hand, if "i" is greater than or equal to the stream length SL, then the computing unit 301 completes the inverse matrix computation of the i-th data.

The arithmetic part 301 calculates the i-th computation result of the exponent part of the 22 inverse matrix computation of source (0), using equation (13).

$$Z\_e[i]=tmp\_e0[i]+A\_e[i] \quad (13)$$

For example, the computing unit 301 initializes "i" to be "i=0" and calculates the i-th computation result of the exponent part, using equation (13) above. The computing unit 301 then increments "i" and determines whether "i" is less than the stream length SL. If "i" is less than the stream length SL, then the computing unit 301 calculates the i-th computation result of the exponent part, using equation (13) above. On the other hand, if "i" is greater than or equal to the stream length SL, then the computing unit 301 completes the computation of the exponent part. As a result, the i-th computation result of the 22 inverse matrix computation of source (0) becomes (Z_f[i],Z_e[i]).

FIG. 6 is an explanatory diagram of a hardware configuration example of the data processing apparatus 100. In FIG. 6, the data processing apparatus 100 includes the stream unit block shift unit 502, the data unit block normalizing unit 503, an instruction decoder 601, an arithmetic data path 602, a multiplexer (MUX) 603, a direct memory access (DMA) 604, instruction memory 605, and data memory 606.

The instruction decoder 601 decodes the contents of an instruction read into the instruction memory 605 and outputs a DMA control signal to the DMA 604 as well as outputs a data path control signal to the arithmetic data path 602. The instruction decoder 601 sets the shift count S of the stream unit in the stream unit block shift unit 502 and sets the DCLSS mode in the MUX 603. For example, the instruction decoder 601 sets "DCLSS=1" in the case of the DCLSS mode-on and sets "DCLSS=0" in the case of the DCLSS mode-off.

The DMA control signal includes an operand indicative of an object of the computation and a destination indicative of a storage location of the computation result. The data path control signal includes the computation code indicative of the type of the instruction. In the example depicted in FIG. 6, the DMA control signal includes src0, src1, dst, and SL. src0 is the address in the data memory 606 at which source (0) is stored. src1 is the address in the data memory 606 at which source (1) is stored. dst is the address at which the computation result is stored in the data memory 606. SL is the stream length. The data path control signal includes mxmul indicative of the multiply instruction.

The arithmetic data path 602 performs various types of matrix computations by switching internal wire connections by a control circuit (not depicted), in response to the data path control signal from the instruction decoder 601. For example, the arithmetic data path 602 has eight 2×2 matrix multiplication modules and eight 2×2 matrix addition modules and each set of four modules has one multiplexer attached thereto. The arithmetic data path 602 can perform the 4×4 matrix multiplication, four 2×2 matrix multiplications in parallel, four 2×2 inverse matrix computations in parallel, etc., by switching the wire connections between the modules.

DMA 604 reads out the source from the data memory 606 and transfers the source to the arithmetic data path 602, in response to the DMA control signal from the instruction decoder 601. The DMA 604 writes to the storage location (destination) of the data memory 606, the computation results to be output from the MUX 603.

The stream unit block shift unit 502 performs the stream unit block shift processing for the computation result from the arithmetic data path 602. The data unit block normalizing unit 503 performs the data unit block normalization processing for the computation result from the arithmetic data path 602. The MUX 603 outputs to the DMA 604, the computation result to be output from the stream unit block shift unit 502 or the data unit block normalizing unit 503, according to the DCLSS mode.

An internal configuration example of the DMA 604 depicted in FIG. 6 will be described. FIG. 7 is an explanatory diagram of an internal configuration example of the DMA 604. In FIG. 7, addr_src0 denotes the address at which source (0) is stored, addr_src1 the address at which source (1) is stored, and addr_dst the destination address. length_src0 denotes the stream length SL of source (0), length_src1 the stream length SL of source (1), and length_dst the stream length SL of the destination.

The DMA 604 includes, for example, a loading unit 710 that reads out source (0), a loading unit 720 that reads out source (1), a storing unit 730 that writes the data to the destination, and a cycle counter 740. The cycle counter 740, for example, outputs to the loading units 710 and 720 and the storing unit 730, the value i, which is incremented by 1 from 0 to N (N=length_dst−1) for each cycle during the period in which one session of stream-type processing is being performed.

The loading unit 710 includes an address generating circuit 711 and a data buffer 712. For example, addr_src0 and length_src0 are input to the address generating circuit 711. The address generating circuit 711 reads out one unit data each cycle, from the address specified by addr_src0 of the data memory 606 and stores the unit data to the data buffer 712. The unit data is a type of data that is treated as an object of computation by the arithmetic data path 602 and for example, the matrix, numerical value, etc., are specified. The data stored in the data buffer 712 is output to the arithmetic data path 602 to become the object of computation, as necessary.

The loading unit 720 includes an address generating circuit 721 and a data buffer 722. For example, addr_src1 and length_src1 are input to the address generating circuit 721. The address generating circuit 721 reads out one unit data each cycle, from the address specified by addr_src1 of the data memory 606 and stores the unit data to the data buffer 722. The data stored in the data buffer 722 is output to the arithmetic data path 602 to become the object of computation, as necessary.

The storing unit 730 includes an address generating circuit 731 and a data buffer 732. For example, addr_dst and length_dst are input to the address generating circuit 731. The address generating circuit 731 writes one unit data stored in the data buffer 732 each cycle to the address specified by addr_dst of the data memory 606. The data buffer 732 stores the computation result output from the MUX 603.

Data processing of the data processing apparatus 100 will be described.

FIG. 8 is a flowchart of one example of the data processing of the data processing apparatus 100. In the flowchart of FIG. 8, the data processing apparatus 100 reads in the instruction from the instruction memory 605 (step S801). The data processing apparatus 100 then sets the shift count S of the stream unit in the stream unit block shift unit 502 and sets the DCLSS mode in the MUX 603 (step S802).

The data processing apparatus 100 transmits a DMA control signal to the DMA 604 and transmits a data path control signal to the arithmetic data path 602 (step S803). The data processing apparatus 100 initializes "i" to be "i=0" (step S804) and reads in the i-th matrix to be subject to computation, from the data memory 606 and performs the matrix computation (step S805).

The data processing apparatus 100 then determines whether the DCLSS mode is "DCLSS=1" (step S806). If "DCLSS=1" (step S806: YES), then the data processing apparatus 100 performs the data unit block normalization processing with respect to the computation result obtained at step S805 (step S807).

On the other hand, if "DCLSS=0" (step S806: NO), then the data processing apparatus 100 performs the stream unit block shift processing with respect to the computation result obtained at step S805 (step S808). The data processing apparatus 100 writes the i-th computation result to the data memory 606 (step S809).

The data processing apparatus 100 then increments "i" (step S810) and determines whether "i" is less than "SL" (step S811). If "i" is less than "SL" (step S811: YES), then the data processing apparatus 100 goes back to step S805. On the other hand, if "i" is greater than or equal to "SL" (step S811: NO), then the data processing apparatus 100 ends the sequence of processing based on this flowchart.

Thus, it is possible to express the floating decimal point by the matrix unit, by allocating the exponent value of the matrix unit, for each matrix included in the array-type data, at the time of the DCLSS mode-on. Further, it possible to express the floating decimal point by the array-type data unit, by shifting the array-type data as a whole at a time by the integer shift instruction, at the time of the DCLSS mode-off.

Specific processing of the matrix computation at step S805 depicted in FIG. 8 will be described. A case of performing the matrix multiplication of the stream data D including the significand part stream and the exponent part stream will be described as an example. Processing of the 22 matrix multiplication of source (0) and source (1) will be described.

FIG. 9 is a flowchart of one example of specific processing of the 22 matrix multiplication. In the flowchart of FIG. 9, the data processing apparatus 100 performs the matrix multiplication of the significand part stream (0) and the significand part stream (1), using equation (5) above (step S901). The data processing apparatus 100 then performs the vector addition of the exponent part stream (0) and the exponent part stream (1), using equation (6) above (step S902).

The data processing apparatus 100 calculates the i-th computation result of the exponent part of the 22 matrix multiplication of source (0) and source (1), using equation (7) above (step S903). The data processing apparatus 100 outputs the i-th computation result (Z_f[i],Z_e[i]) of the 22 matrix multiplication of source (0) and source (1) (step S904), ending a sequence of processing based on this flowchart. Thus, it possible to perform the 22 matrix computation between two data streams D including the significand part stream and the exponent part stream.

Specific processing of the 22 matrix addition of source (0) and source (1) will be described.

FIG. 10 is a flowchart of one example of specific processing of the 22 matrix addition. In FIG. 10, the data processing apparatus 100 performs the vector subtraction of the exponent part stream (0) and the exponent part stream (1), using equation (8) above (step S1001). The data processing apparatus 100 then determines if tmp_e0[i] is greater than or equal to 0 (step S1002).

If tmp_e0[i] is greater than or equal to 0 (step S1002: YES), then the data processing apparatus 100 performs the 22 matrix addition with shifting, using equation (9) above (step S1003). On the other hand, if tmp_e0[i] is not greater than or equal to 0 (step S1002: NO), then the data processing apparatus 100 performs the 22 matrix addition with shifting, using equation (10) above (step S1004).

The data processing apparatus 100 calculates the i-th computation result of the exponent part of the 22 matrix addition of source (0) and source (1), using equation (11) above (step S1005). The data processing apparatus 100 then outputs the i-th computation results (Z_f[i],Z_e[i]) of the 22 matrix addition of source (0) and source (1) (step S1006), ending a sequence of processing based on this flowchart. Thus, it possible to perform the 22 matrix addition between two data streams D including the significand part stream and the exponent part stream.

Specific processing of the 22 inverse matrix computation of source (0) will be described.

FIG. 11 is a flowchart of one example of specific processing of the 22 inverse matrix computation. In the flowchart of FIG. 11, the data processing apparatus 100 performs inverse matrix computation of the i-th data included in the significand part stream (0), using equation (12) above (step S1101).

The data processing apparatus 100 calculates the i-th computation result of the exponent part of the 22 inverse matrix computation of source (0), using equation (13) above (step S1102). The data processing apparatus 100 then outputs the i-th computation result (Z_f[i],Z_e[i]) of the 22 inverse matrix computation of source (0) (step S1103), ending a sequence of processing based on this flowchart. Thus, it possible to perform the 22 inverse matrix computation of source (0).

A case of applying the data processing apparatus 100 according to the first embodiment to a baseband processing large scale integrated circuit (LSI) of a cell-phone will be described.

Figure 12:
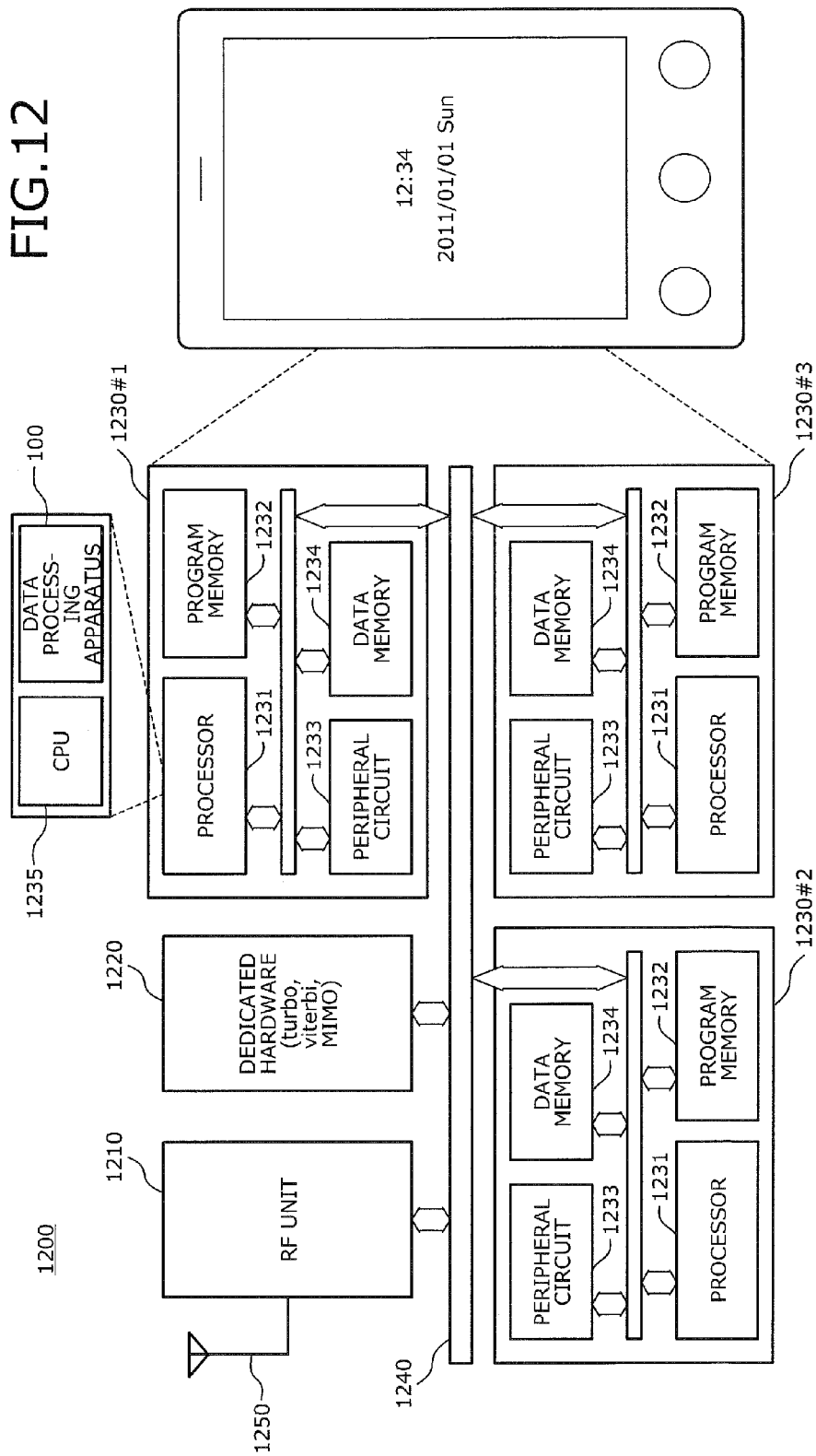
FIG. 12 is an explanatory diagram of an application example of the data processing apparatus 100.

FIG. 12 is an explanatory diagram of an application example of the data processing apparatus 100. In FIG. 12, a baseband processing LSI 1200 includes a radio frequency (RF) unit 1210, dedicated hardware 1220, digital signal processors (DSPs) 1230#1 to 1230#3.

The RF unit 1210 down-converts the frequency of a radio signal received by way of an antenna 1250, converts the radio signal to a digital signal, and outputs the resulting signal to a bus 1240. The RF unit 1210 converts the digital signal output to the bus 1240 to an analog signal, up-converts the analog signal to the radio frequency, and outputs the resulting signal to the antenna 1250.

The dedicated hardware 1220 includes, for example, a turbo to handle error-correcting code, a Viterbi to execute Viterbi algorithm, a multiple input/multiple output (MIMO) to transmit and receive data by plural antennas, etc.

Each of the DSPs 1230#1 to 1230#3 (hereinafter referred to simply as "DSP 1230") includes a processor 1231, program memory 1232, a peripheral circuit 1233, and data memory 1234. The processor 1231 includes a CPU 1235 and the data processing apparatus 100. Processing elements of the radio communication signal processing, such as a searcher (synchronization), a demodulator (demodulation), a decoder (decoding), a codec (encoding), and a modulator (modulation), are allocated to the DSPs 1230.

As described above, the data processing apparatus 100 according to the first embodiment can determine for each matrix to be obtained by the matrix computation of a data stream D, the exponent value of the matrix unit in the case of expressing each element in as a floating decimal point value, based on the value of each element included in the matrix. The data processing apparatus 100 can convert the value of each element included in the matrix to the significand value of each element corresponding to the exponent value of the matrix unit and, correlate and output the matrix after the conversion and the exponent value of the matrix unit.

Thus, it is possible to express matrix units as floating decimal point values, by allocating the exponent value of the matrix unit, for each matrix to be obtained by the matrix computation of a data stream D. As a result, it is possible to suppress increases in the circuit scale as compared to a case of processing each numerical value included in the array-type data as a floating decimal point value. Further, it is possible to enhance the calculation accuracy as compared to a case of performing the computation after shifting the array-type data as a whole at a time by an integer shift instruction. For example, in the radio communication signal processing of the LTE, etc., the array-type data whose unit data is a matrix has the characteristics that while the values of the elements included in one matrix are approximate to one another as absolute values, the values of the elements between the matrices differ widely as absolute values. For this reason, with the matrix computation performed by allocating the exponent value of the matrix unit for each matrix included in the array-type data, the calculation accuracy can be enhanced efficiently.

The data processing apparatus 100 can determine for each matrix to be obtained by the matrix computation of the stream data D, the exponent value in the case of expressing as a floating decimal point value, the element whose absolute value is the greatest among plural elements included in the matrix as the exponent value of the matrix unit. Thus, it is possible to unify and normalize the exponent parts of all elements included in the matrix by the exponent part of the element whose absolute value is the greatest, thereby enhancing the calculation accuracy.

In the case of performing the matrix addition computation between two data streams D including the significand part stream and the exponent part stream, the data processing apparatus 100 can calculate the difference of the corresponding exponent values between the two data streams D. The data processing apparatus 100 can shift the value of each element included in either one of the corresponding matrices between the two data streams D, based on the difference of the corresponding exponent values between the two data streams D. This makes it possible to cause the exponent values of the matrices subject to computation to match, enabling the matrix addition computation of the two data streams D.

The data processing apparatus 100 can arbitrarily select the DCLSS mode. This makes it possible to select the DCLSS mode-on in the case of performing matrix computation that is highly likely to increase the number of bits required to express the computation result at a time and select the DCLSS mode-off in other cases, suppressing the amount of processing required for the matrix computation.

Thus, the data processing apparatus, the data processing method, and the data processing program according to the first embodiment can suppress increases in circuit scale related to the matrix computation of the array-type data as well as enhance the calculation accuracy.

The data processing apparatus 100 according to a second embodiment will be described. Components identical to those of the first embodiment are given the same reference numerals used in the first embodiment and description thereof is omitted hereinafter.

Although in the first embodiment, a case is described where the unit data length is fixed, in the second embodiment, a case will be described where the unit data length is variable. The unit data length is the length of a unit of a matrix format (or vector format) data and is, for example, represented by the number of elements included in the unit of data. In the description hereinafter, the unit data length may be denoted as "unit data length UL".

For example, in the example of the computation result 400 depicted in FIG. 4, the unit data length UL is fixed as (N+1) elements (c[0] to c[N]) per cycle. On the other hand, the unit data length UL changes according to the issued instruction. Consequently, with the unit data length UL changing for each instruction, the SIMD width (parallelism) changes.

Here, the data processing width per cycle is regarded as "the data processing width L (fixed)", where the SIMD width is "L/UL". The data processing width L is determined according to the hardware resources of the data processing apparatus 100 and is the data width that can be processed in 1 cycle. The SIMD width is the number of unit data that can be processed in parallel per cycle.

For example, if the data processing width L is L=16, with a 4×4 matrix instruction, the unit data length UL is 16 and the SIMD width is 1 SIMD, i.e., 16 elements of 1 data/cycle. Further, in the case of a 2×2 matrix instruction, the unit data length UL is 4 and the SIMD width is 4 SIMD, i.e., 4 elements of 4 data/cycle.

Thus, in the second embodiment, a data processing method will be described that can be implemented by logic that is as simple as possible for determining the data unit exponent value when each element included in 1 unit data is expressed as a floating decimal point value and for performing normalization processing of data unit blocks to convert the value of each element into a significand value according to the exponent value of the data unit even when the unit data length UL is variable.

Specific processing of the determining unit 302 (see FIG. 33) and the converting unit 303 (see FIG. 3) of the data processing apparatus 100 according to the second embodiment will be described.

Figure 13:
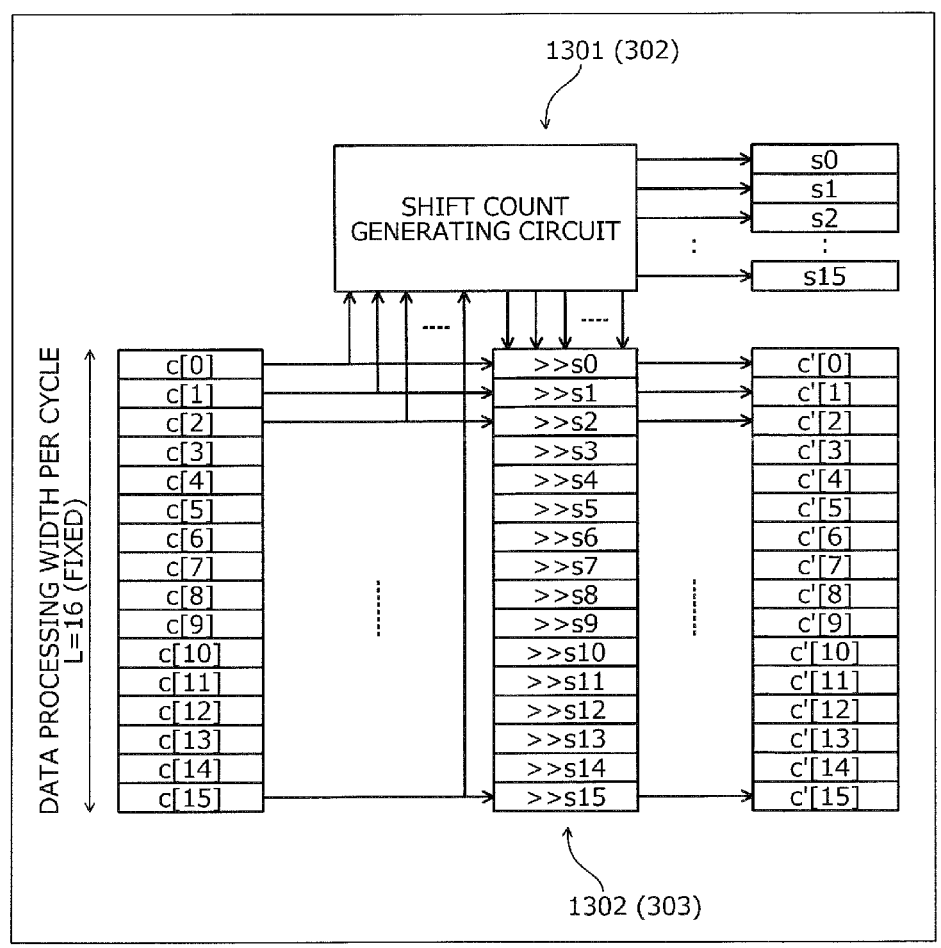
FIG. 13 is an explanatory diagram of processing performed by the determining unit 302 and the converting unit 303 of the data processing apparatus 100 according to a second embodiment.

FIG. 13 is an explanatory diagram of processing performed by the determining unit 302 and the converting unit 303 of the data processing apparatus 100 according to the second embodiment. In FIG. 13, a shift count generating circuit 1301 is a determining circuit of the determining unit 302. Further, a shifter 1302 is a shifting circuit of the converting unit 303.

The shift count generating circuit 1301, from the head of a series of elements obtained from the matrix computation by the computing unit 301 (see FIG. 3), determines for each element set of the element count unit, which is the unit data length UL, the exponent value of the element set. For example, based on the value of each element included in an element set, the shift count generating circuit 1301 determines the exponent value for the element set when the elements are expressed by a floating decimal point value.

In the example depicted in FIG. 13, the data processing width L is L=16; c[0] to c[15] are a series of element values representing the matrix computation of source (0) and source (1). Here, the unit data length UL is assumed to be UL=4. In this case, from the head of a series of elements included in the matrix computation result of source (0) and source (1), the shift count generating circuit 1301 determines for each element set of 4 units, which is the unit data length UL, the exponent value of the element set.

In the description hereinafter, elements included in the matrix computation results of source (0) and source (1) may be denoted as "element c[k]", using the value of the element (in the example depicted in FIG. 13, k=0, 1, . . . , 15). Further, the exponent value of an element set may be denoted as "element set shift count s".

For example, for the element set c[0] to c[3], the shift count generating circuit 1301 identifies the element having the greatest absolute value among the element set c[0] to c[3]. The shift count generating circuit 1301 normalizes the value of the element having the greatest absolute value and calculates the significand value and the exponent value. The shift count generating circuit 1301 determines the exponent value of the element having the greatest absolute value to be the element set shift count s.

For example, assuming that the element having the greatest absolute value in the element set c[0] to c[3] is the element c[0], in this case the element set shift count s is s=s0. In other words, the shift counts s0 to s3 of the elements c[0] to c[3] are the same shift count s(s0).

Similarly, for an element set c[4] to c[7], the shift count generating circuit 1301 determines the exponent value obtained by normalizing the value of the element having the greatest absolute value among the element set c[4] to c[7] to be the element set shift count s. In other words, the shift counts s4 to s7 of the elements c[4] to c[7] are the same shift count s.

Similarly, for an element set c[8] to c[11], the shift count generating circuit 1301 determines the exponent value obtained by normalizing the value of the element having the greatest absolute value among the element set c[8] to c[11] to be the element set shift count s. In other words, the shift counts s8 to s11 are the same shift count s.

Similarly, for an element set c[12] to c[15], the shift count generating circuit 1301 determines the exponent value obtained by normalizing the value of the element having the greatest absolute value among the element set c[12] to c[15] as the element set shift count s. In other words, the shift counts s12 to s15 of the elements c[12] to c[15] is the same shift count s.

The shifter 1302, for each element set of an element count unit that is the unit data length UL, converts the value of each element included in the element set, into the significand value of the element according to the element set shift count s determined by the shift count generating circuit 1301.

For example, for the element set c[0] to c[3], the shifter 1302 shifts the value of each element by the element set shift count s determined by the shift count generating circuit 1301 and performs a computation with respect to each value. For example, the shifter 1302 shifts the value of each element by the shift counts s0 to s3 (s=s0=s1=s2=s3), performs a computation with respect to each value, and calculates the significand value c'[0] to c'[3] of each element. Thus, the shifter 1302 converts the value of each element into the calculated significand value c'[0] to c'[3] of each element.

Similarly, for the element set c[4] to c[7], the shifter 1302 shifts the value of each element by the shift counts s4 to s7, performs a computation with respect to each value, and calculates the significand value c'[4] to c'[7] of each element. Thus, the shifter 1302 converts the value of each element into the calculated significand value c'[4] to c'[7] of each element.

Similarly, for the element set c[8] to c[11], the shifter 1302 shifts the value of each element by the shift values s8 to s11, performs a computation with respect to each value, and calculates the significand value c'[8] to c'[11] of each element. Thus, the shifter 1302 converts the value of each element into the calculated significand value c'[8] to c'[11] of each element.

Similarly, for the element set c[12] to c[15], the shifter 1302 shifts the value of each element by the shift counts s12 to s15, performs a computation with respect to each value, and calculates the significand value c'[12] to c'[15] of each element. Thus, the shifter 1302 converts the value of each element into the calculated significand value c'[12] to c'[15] of each element.

In this case, the output unit 304 (see FIG. 3) correlates and outputs the series of resulting converted elements c'[0] to c'[15] and the shift counts s0 to s15. For example, the output unit 304 correlates the element shift count s with each element set of the element count unit that is the unit data length UL, among the series of resulting converted elements c'[0] to c'[15].

As described, according to the data processing apparatus 100 of the second embodiment, from the head of a series of elements and for each element set of the element count unit that is the unit data length UL, the element set shift count s can be determined to express, as a floating decimal point value, each element included in the element set. Further, according to the data processing apparatus 100, for each element set, the value of each element included in the element set can be converted into the significand value of the element according to the element set shift count s. According to the data processing apparatus 100, the value of each element included in the post-conversion element set and the element set shift count s can be correlated and output.

Consequently, even if the unit data length UL is variable, data unit block normalization can be implemented, a data unit exponent value can be assigned according to the variable unit data length UL and expressed as a floating decimal point value for each data unit.

An example of the data processing apparatus 100 according to the first and the second embodiments will be described. A first example of the data processing apparatus 100 will be described. In the description hereinafter, unless otherwise specified, the data processing width L is assumed to be L=16, and the series of elements (array-type data) obtained by the matrix computation by the computing unit 301 (see FIG. 3) is assumed to be elements c[0] to c[15].

Figure 14:
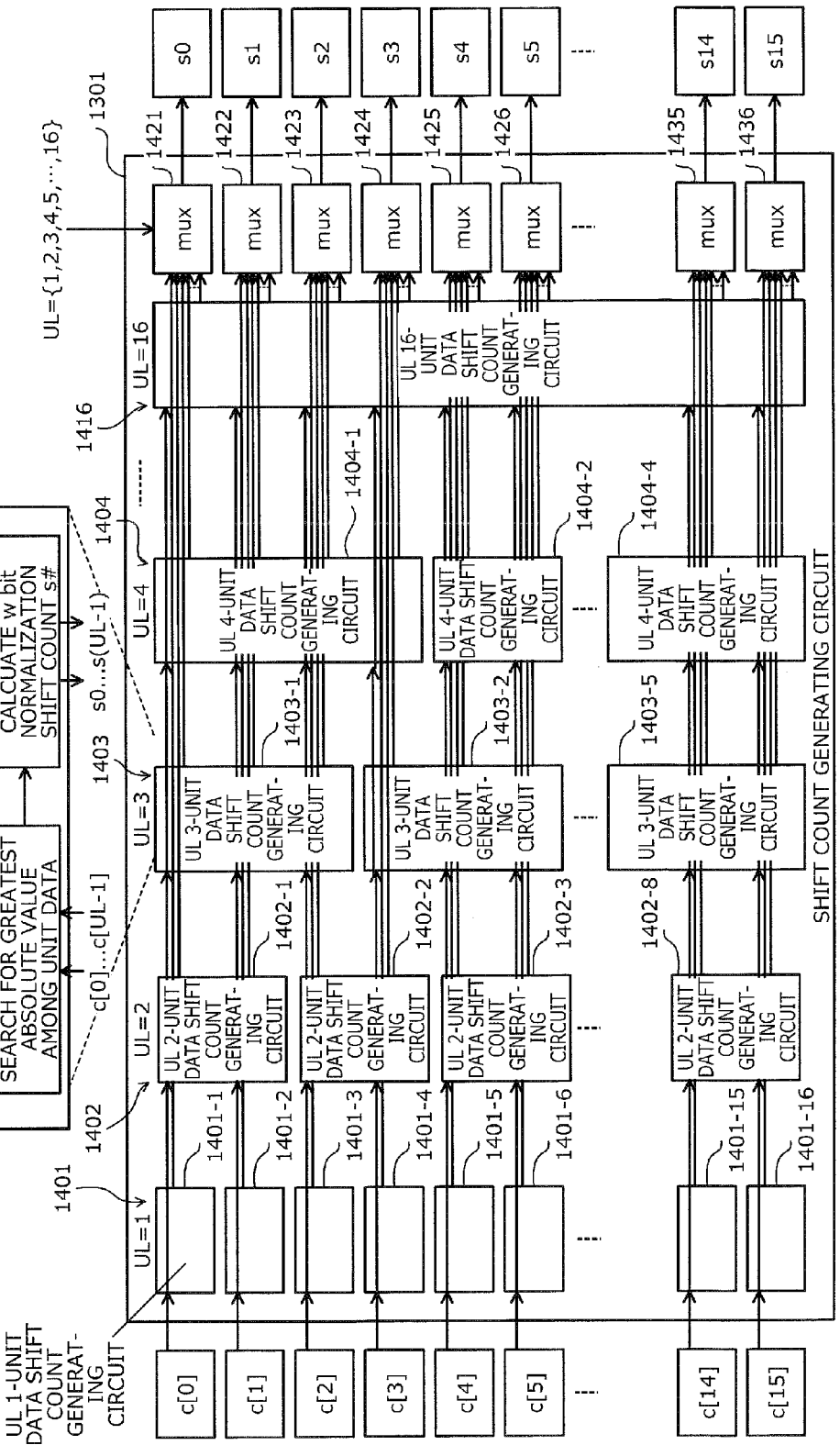
FIG. 14 is an explanatory diagram depicting a circuit configuration example of a shift count generating circuit 1301 according to a first example.

FIG. 14 is an explanatory diagram depicting a circuit configuration example of the shift count generating circuit 1301 according to the first example. In FIG. 14, the shift count generating circuit 1301 includes UL n-unit data shift count generating circuits 1401 to 1416 and MUXs 1421 to 1436. The UL n-unit data shift count generating circuits 1401 to 1416 are determining circuits respectively corresponding to n elements included among the elements c[0] to c[15], where n=1, 2, . . . , 16) and the upper limit of n is 16. The MUXs 1421 to 1436 are selecting circuits corresponding to the elements c[0] to c[15].

For example, the UL 1-unit data shift count generating circuit 1401 (n=1) has UL 1-unit data shift count generating circuits 1401-1 to 1401-16, and from the head of the elements c[0] to c[15] and for each element set of 1-unit, determines the element set shift count s. In this case, the elements included in an element set are 1 element.

For example, the UL 1-unit data shift count generating circuit 1401-1 receives input of the value of the element c[0], normalizes the value of the element c[0], calculates the significand value and the exponent value, and determines the calculated exponent value to be the element set shift count s (shift count s0). The determined shift count s0 is input to the MUX 1421.

Similarly, the UL 1-unit data shift count generating circuits 1401-2 to 1401-16 determine element set shift counts s (shift counts s1 to s15). Further, the determined shift counts s1 to s15 are input into the MUXs 1422 to 1436, respectively.

Further, for example, the UL 2-unit data shift count generating circuit 1402 (n=2) has a UL 2-unit data shift count generating circuits 1402-1 to 1402-8, and from the head of the elements c[0] to c[15] and for each element set of 2-units, determines the element set shift count s.

For example, the UL 2-unit data shift count generating circuit 1402-1 receives input of the elements c[0], c[1], normalizes the value of the element having the greatest absolute value among the element set c[0], c[1]; and calculates the significand value and the exponent value. The UL 2-unit data shift count generating circuit 1402-1 determines the calculated exponent value to be the element set shift count s (s=s0=s1). The determined shift counts s0, s1 are input into the MUX 1421, 1422, respectively.

Similarly, the UL 2-unit data shift count generating circuits 1402-2 to 1402-8 determine the element set shift count s (shift counts s2 to s15), respectively. Further, the determined shift counts s2 to s15 are input into the MUXs 1423 to 1436, respectively. Similarly, the UL 3-unit data shift count generating circuit 1403 (n=3) to the UL 16-unit data shift count generating circuit 1416 (n=16) determine the element set shift count s, respectively.

The MUXs 1421 to 1436, from among the input element set shift counts s, selects the element set shift count s that is for an element set that of an element count equivalent to the unit data length UL, for each of the elements included among the elements c[0] to c[15]. The element count that is the unit data length UL is input to the MUXs 1421 to 1436.

For example, the unit data length UL is assumed to be UL=1. In this case, for example, the MUX 1421 selects as the element set shift count s, the shift counts s0 input by the UL 1-unit data shift count generating circuit 1401-1. Further, if the unit data length UL is assumed to be UL=2, in this case, for example, the MUX 1421 selects as the element set shift count s, the shift counts s0 input by the UL 2-unit data shift count generating circuit 1402-1.

The shift counts s (shift counts s0 to s15) selected by the MUXs 1421 to 1436 are input into the shifter 1302 depicted in FIG. 13. As a result, the shifter 1302 converts the value of each of the element c[0] to c[15] into the significand value c'[0] to c'[15] with respect to the shift counts s respectively selected by the MUXs 1421 to 1436.

According to the data processing apparatus 100 of the first example, even when the unit data length UL is an element count n (n=1, 2, . . . , 16), where the upper limit is the data processing width L, normalization processing can be performed with respect to data unit blocks that correspond to the unit data length UL.

The data processing apparatus 100 according to a second example will be described.

Figure 15:
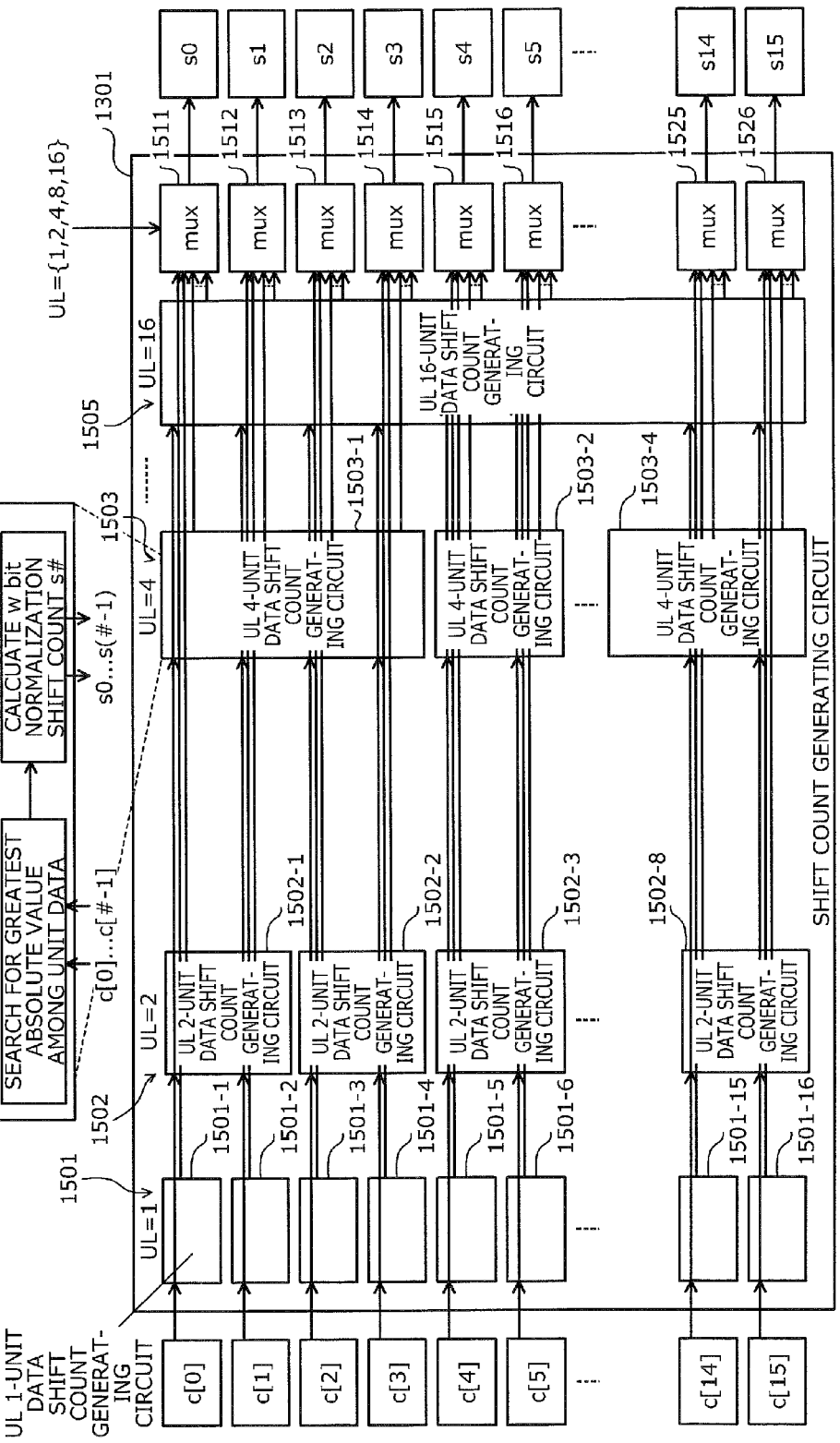
FIG. 15 is an explanatory diagram depicting a circuit configuration example of the shift count generating circuit 1301 according to a second example.

FIG. 15 is an explanatory diagram depicting a circuit configuration example of the shift count generating circuit 1301 according to a second example. In FIG. 15, the shift count generating circuit 1301 includes UL n-unit data shift count generating circuits 1501 to 1505 respectively corresponding to an element count n (n=1, 2, 4, 8, 16) of powers of 2, where the total number of elements, 16, included among the elements c[0] to c[15] is an upper limit. The shift count generating circuit 1301 further includes MUXs 1511 to 1526 corresponding to the elements c[0] to c[15].

For example, the UL 1-unit data shift count generating circuit 1501 (n=1) has UL 1-unit data shift count generating circuits 1501-1 to 1501-16, and from the head of the elements c[0] to c[15] and for each element set of 1-unit, determines the element set shift count s. In this case, the elements included in the element set are 1 element.

For example, the UL 2-unit data shift count generating circuit 1502 (n=2) has UL 2-unit data shift count generating circuits 1502-1 to 1502-8, and from the head of the elements c[0] to c[15] and for each element set of 2-units, determines the element set shift count s.

For example, the UL 4-unit data shift count generating circuit 1503 (n=4) has UL 4-unit data shift count generating circuits 1503-1 to 1503-4, and from the head of the elements c[0] to c[15] and for each element set of 4-units, determines the element set shift count s.

Similarly, the UL 8-unit data shift count generating circuit 1504 (n=8) and the UL 16-unit data shift count generating circuit 1505 (n=16) determine element set shift counts s.

The MUXs 1511 to 1526, from among the respectively input element set shift counts s, selects the element set shift count s that is for an element count that is equivalent to the unit data length UL. The element count that is equivalent to the unit data length UL is input into the MUX 1511 to 1526.

For example, the unit data length UL is assumed to be UL=2. In this case, for example, the MUX 1511 selects, as the element set shift count s, the shift counts s0 input by the UL 2-unit data shift count generating circuit 1502-1. Further, if the unit data length UL is assumed to be UL=4, in this case, for example, the MUX 511 selects, as the element set shift count s, the shift counts s0 input by the UL 4-unit data shift count generating circuit 1503-1.

The shift counts s (shift counts s0 to s15) respectively selected by the MUXs 1511 to 1526 are input into the shifter 1302 depicted in FIG. 13. As a result, the shifter 1302 converts the value of each of the elements c[0] to c[15] into the significand value c'[0] to c'[15] with respect to the shift counts s respectively selected by the MUXs 1511 to 1526.

According to the data processing apparatus 100 of the second example, by limiting the number of the UL n-unit data shift count generating circuits to an element count n, which is a power of 2, with the data processing width L as an upper limit, compared to the data processing apparatus 100 of the first example, the circuit volume of the shift count generating circuit 1301 can be suppressed.

Figure 16A:
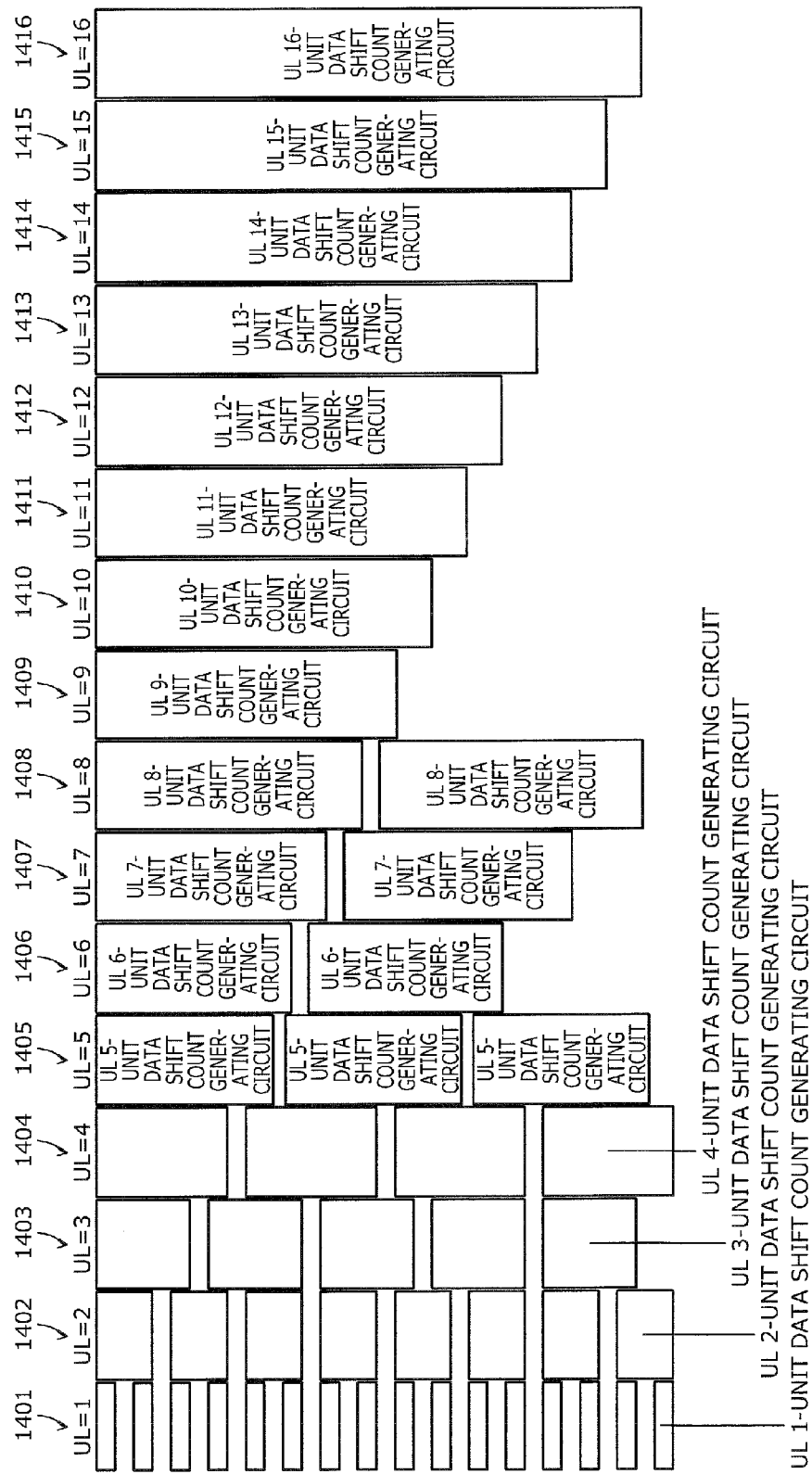

With reference to FIG. 16A and FIG. 16B, circuit configurations of the shift count generating circuit 1301 according to the first example and of the shift count generating circuit 1301 according to the second example will be compared.

FIGS. 16A and 16B are explanatory diagrams depicting a comparison example of the circuit configurations of the shift count generating circuit 1301. FIG. 16A depicts an example of a circuit configuration of the shift count generating circuit 1301 (see FIG. 14) of the first example. FIG. 16B depicts an example of a circuit configuration of the shift count generating circuit 1301 (see FIG. 15) of the second example.

As depicted in FIGS. 16A and 16B, compared to the shift count generating circuit 1301 of the first example, the shift count generating circuit 1301 of the second example can reduce the circuit volume by the UL n-unit data shift count generating circuits corresponding to UL=3, 5, 6, 7, 9, 10, 11, 12, 13, 14, and 15.

Meanwhile, with the shift count generating circuit 1301 of the second example, the UL n-unit data shift count generating circuits are limited to a power of 2 and therefore, there may be cases where a UL n-unit data shift count generating circuit corresponding to the unit data length UL is not present. For example, when the unit data length UL is UL=3, a UL n-unit data shift count generating circuit corresponding to the unit data length UL is not present.

In this case, the shift count generating circuit 1301 may use a UL n-unit data shift count generating circuit that corresponds to an element count that is greater than the unit data length UL and determine the element set shift count s for the element count that is equivalent to the unit data length UL. For example, when the unit data length UL is UL=3, the shift count generating circuit 1301 may use the UL 4-unit data shift count generating circuit 1503 and determine the element set shift count s.

Hereinafter, a case will be described where a UL n-unit data shift count generating circuit corresponding to an element count that is greater than the unit data length UL is used to determine the element set shift count s for an element count that is the unit data length UL. First, an example of a circuit configuration of the computing unit 301 depicted in FIG. 3 will be described with reference to FIG. 17.

FIG. 17 is an explanatory diagram depicting an example of a circuit configuration of the computing unit 301. In FIG. 17, the computing unit 301 includes MUXs 1701 to 1716, and computing devices 1721 to 1728. In the example depicted in FIG. 17, the data processing width L is assumed to be L=8, source (0) is assumed to be a[0] to a[7], and source (1) is assumed to be b[0] to b[7].

For example, the MUX 1701 is a selecting circuit that receives input of source (0), selects an element from source (0) according to an instruction, and outputs the selected element to the computing device 1721. Similarly, the MUXs 1703, 1705, 1707, 1709, 1711, 1713, and 1715 are selecting circuits that receive input of source (0), select an element from source (0) according to an instruction, and output the selected element to the computing devices 1722 to 1728, respectively.

Further, for example, the MUX 1702 is a selecting circuit that receives input of source (1), selects an element from source (1) according to an instruction, and outputs the selected element to the computing device 1721. Similarly, the MUXs 1704, 1706, 1708, 1710, 1712, 1714, and 1716 are selecting circuits that receive input of source (1), select an element from source (1) according to an instruction, and output the selected element to the computing devices 1722 to 1728, respectively.

Further, for example, the computing device 1721 multiples the elements respectively input by the MUXs 1701, 1702; and outputs the computation result c[0]. Similarly, the computing devices 1722 to 1728 multiply the input elements, and output computation results c[1] to c[7], respectively.

Figure 19:
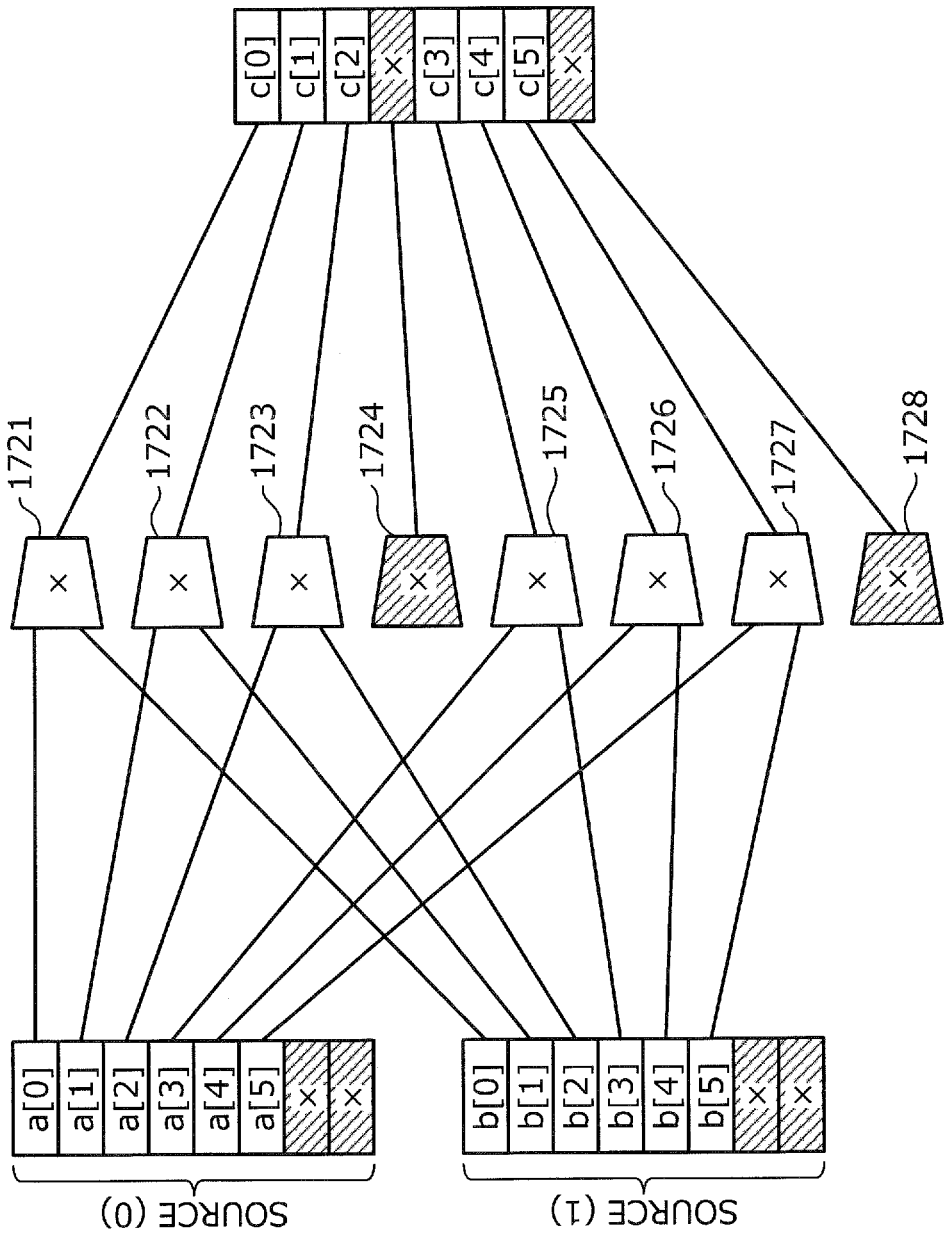
FIG. 19 is an explanatory diagram of a configuration example of a data path (part 2)

With reference to FIGS. 18 and 19, a configuration example of a data path of the computing unit 301, in a case where the data processing width L is L=8 will be described as an example.

FIG. 18 is an explanatory diagram of a configuration example of a data path (part 1). In the example depicted in FIG. 18, the unit data length UL defined according to an instruction is assumed to be UL=4; source (0) is assumed to be a[0] to a[7]; and source (1) is assumed to be b[0] to b[7]. In this case, the data path is configured by 2 SIMD (2=8/4).

For example, from the head of source (0), 4 elements a[0] to a[3] are respectively input into the computing devices 1721 to 1724; and from the head of source (1), 4 elements b[0] to b[3] are respectively input into the computing devices 1721 to 1724. The computing devices 1721 to 1724 perform multiplication with respect to the elements, and output the computation results c[0] to c[3].

The subsequent 4 elements a[4] to a[7] of source (0) are respectively input into the computing devices 1725 to 1728; and the subsequent 4 elements b[4] to b[7] of source (1) are input into the computing devices 1725 to 1728. The computing devices 1725 to 1728 perform multiplication with respect to the elements and output the computation results c[4] to c[7].

FIG. 19 is an explanatory diagram of a configuration example of a data path (part 2). In the example depicted in FIG. 19, the unit data length UL defined according to an instruction is assumed to be UL=3; source (0) is assumed to be a[0] to a[5]; and source (1) is assumed to be b[0] to b[5]. In this case, a UL 3-unit data shift count generating circuit that corresponds to the unit data length UL is not present in the shift count generating circuit 1301.

Consequently, the shift count generating circuit 1301 uses the UL 4-unit data shift count generating circuit 1503 (see FIG. 15) that corresponds to an element count of 4, which is greater than the unit data length UL of 3, and determines the element set shift count s. In other words, the data path is configured by 2 SIMD (2=8/4).

The shift count generating circuit 1301 selects elements from source (0) and source (1), and performs computations such that the elements are aligned as powers of 2 at the MUXs 1701 to 1716 that are at the input side of the computing devices 1721 to 1724. For example, from the head of source (0), the 3 elements a[0] to a[2] are respectively input into the computing devices 1721 to 1723; and from the head of source (1), the 3 elements b[0] to b[2] are respectively input into the computing devices 1721 to 1723. The computing devices 1721 to 1723 perform multiplication with respect to the elements, and output the computation results c[0] to c[2].

The subsequent 3 elements a[3] to a[5] of source (0) are respectively input into the computing devices 1725 to 1727; and the subsequent 3 elements b[3] to b[5] of source (1) are respectively input into the computing devices 1725 to 1727. The computing devices 1725 to 1727 perform multiplication with respect to the elements, and output the computation results c[3] to c[5]. In other words, the shift count generating circuit 1301 when performing computation, selects from source (0) and source (1), elements such that from the head, the fourth and the eighth computing devices 1724 and 1728 are skipped.

Thus, when the UL n-unit data shift count generating circuit that corresponds to an element count that is greater than the unit data length UL, the UL n-unit data shift count generating circuit into which the elements are to be input can be suitably adjusted. As a result, even when the unit data length UL is an element count n (n=3, 5, 6, 7, 9, 10, 11, 12, 13, 14, 15) other than a power of 2, normalization processing can be implemented with respect to a data unit block that corresponds to the unit data length UL.

Further, by limiting the UL n-unit data shift count generating circuits to power of 2, when normalization processing is performed with respect to a data unit block that corresponds to a unit data length UL that is not a power of 2, the SIMD width (parallelism) does not decrease easily and drops in the processing performance of the data processing apparatus 100 can be suppressed.

For example, compared to the data processing apparatus 100 of the first example, when the unit data length UL is UL=3, the SIMD width is reduced from 5 SIMD to 4 SIMD, and when the unit data length UL is UL=5, the SIMD width is reduced from 3 SIMD to 2 SIMD, i.e., the processing performance drops. Nonetheless, when the unit data length UL is a value other than UL=3 or 5, compared to the data processing apparatus 100 of the first example, normalization processing with respect to data unit blocks can be implemented without reducing the SIMD width.

In the description above, although the UL n-unit data shift count generating circuits are limited to powers of 2, configuration is not limited hereto. For example, the UL n-unit data shift count generating circuits may be limited to a count other than 2 (e.g., 3) with the data processing width L as an upper limit, or may be limited to an odd or even element count n.

The data processing apparatus 100 according to a third example will be described. In the third example, to suppress the circuit volume of the data processing apparatus 100, a case where the shifter 1302 is shared by a DCLSS mode-on and a DCLSS mode-off.

Figure 20:
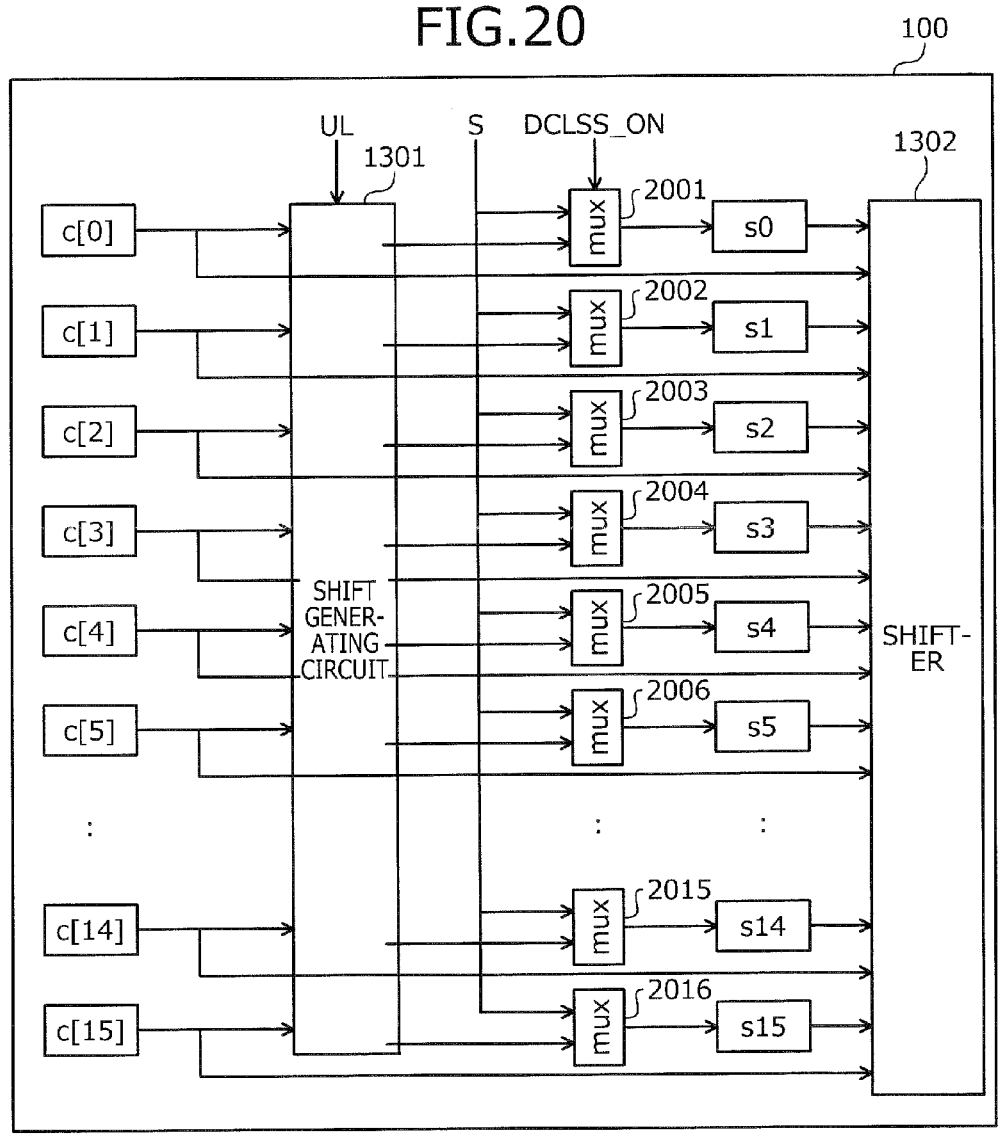
FIG. 20 is an explanatory diagram depicting a circuit configuration example of the data processing apparatus 100 according to a third example.

FIG. 20 is an explanatory diagram depicting a circuit configuration example of the data processing apparatus 100 according to the third example. In FIG. 20, the data processing apparatus 100 includes the shift count generating circuit 1301, the shifter 1302, and MUXs 2001 to 2016. In FIG. 20, a portion of the circuit configuration of the data processing apparatus 100 is depicted.

The shift count generating circuit 1301 receives input of the elements c[0] to c[15], determines the shift counts s of the elements c[0] to c[15], and outputs the shift counts s determined for the element c[0] to c[15] to the corresponding MUXs 2001 to 2016, respectively.

The MUXs 2001 to 2016 are selecting circuits that correspond to the elements c[0] to c[15]. For example, the MUX 2001 receives input of the shift counts s for the element c[0] and the shift count S for the data stream unit, and outputs to the shifter 1302, as the shift count s0 for the element c[0] according to the DCLSS mode, any one among the shift count s and the shift count S.

For example, in the case of DCLSS mode-on, the MUX 2001 outputs the shift count s to the shifter 1302. On the other hand, in the case of DCLSS mode-off, the MUX 2001 outputs the shift count S to the shifter 1302. The DCLSS mode is set, for example, by the instruction decoder 601 depicted in FIG. 6.

Similarly, the MUXs 2002 to 2016 receive input of the shift counts s for the elements c[1] to c[15] and the shift count S, and output to the shifter 1302, as the shift counts s1 to s15 for the elements c[1] to c[15] according to the DCLSS mode, any one among the shift counts s and the shift count S.

The shifter 1302 receives input of the elements c[0] to c[15] and the shift counts s0 to s15, and converts the value of the elements c[0] to c[15] into the significand value c'[0] to c'[15] according to the shift counts s0 to s15. In other words, in the case of DCLSS mode-on, the shifter 1302, for each element set of an element count unit that is the unit data length UL, converts the value of each element included in the element set into a significand value according to the element set shift counts s determined by the shift count generating circuit 1301.

On the other hand, in the case of DCLSS mode-off, the shifter 1302 converts the value of each element among the elements c[0] to c[15] into a significand value according to the shift count S. The element set shift counts s are the shift counts s respectively selected by the MUXs 1421 to 1436 of the shift count generating circuit 1301 depicted in FIG. 14 and the MUXs 1511 to 1526 of the shift count generating circuit 1301 depicted in FIG. 15.

According to the data processing apparatus 100 of the third example, the shifter 1302 can be shared through the DCLSS mode-on and the DCLSS mode-off. Consequently, the DCLSS mode that receives an integer stream as input and outputs the significand part stream and the exponent part stream can be implemented while suppressing increases in circuit volume.

The data processing apparatus 100 according to a fourth example will be described. In the fourth example, the shift count generating circuit 1301 will be described that can output suitable element set shift counts s and exponent value s0 to s15 for the elements c[0] to c[15] even when the elements included among the elements c[0] to c[15] are expressed as floating decimal point values and not integers.

For example, the shift count generating circuit 1301, from the head of the elements c[0] to c[15] and for each element set of an element count unit that is the unit data length UL, determines as the element set shift count s, the exponent value s_max, which is the greatest exponent value among the exponent values e of the elements included in the element set. The shifter 1302, for each element set, converts the significand value f of each element included in the element set, into the significand value of the elements for the exponent value resulting after subtracting the exponent values e of the elements from the exponent value s_max.

An operation example of the shift count generating circuit 1301 will be described with reference to FIG. 21. In the example depicted in FIG. 21, among the UL n-unit data shift count generating circuits in the shift count generating circuit 1301, the UL 3-unit data shift count generating circuit 1403-1 (see FIG. 14) will be described as an example. Further, the unit data length UL is assumed to be UL=3.

Figure 21:
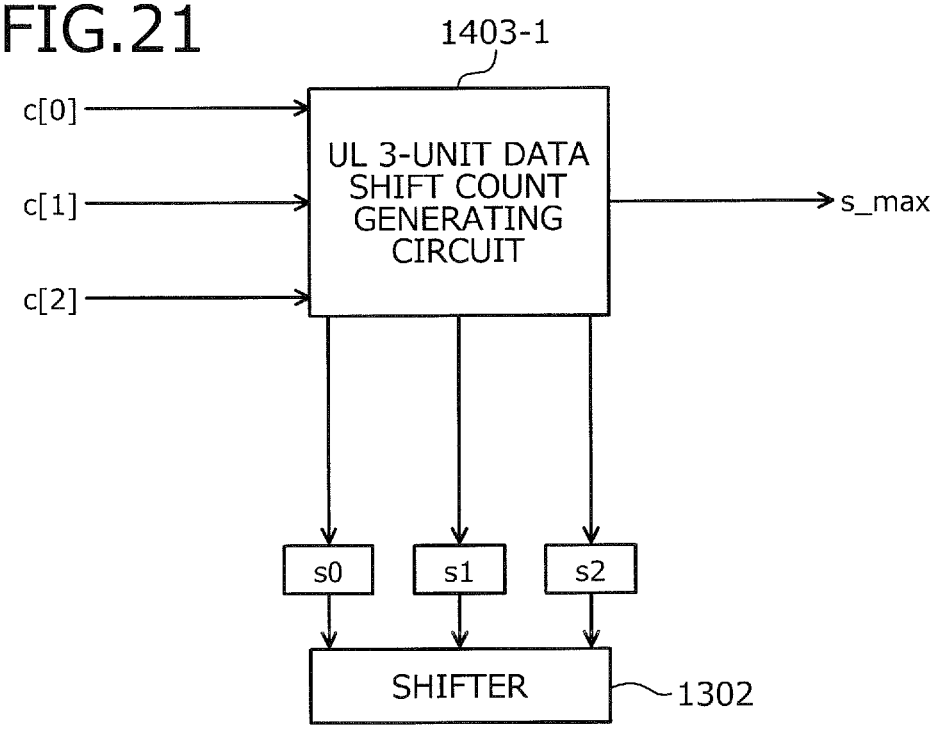
FIG. 21 is an explanatory diagram depicting an operation example of a UL n-unit data shift count generating circuit in the shift count generating circuit 1301 of a fourth example.

FIG. 21 is an explanatory diagram depicting an operation example of a UL n-unit data shift count generating circuit in the shift count generating circuit 1301 of the fourth example. In FIG. 21, the UL 3-unit data shift count generating circuit 1403-1 receives input of a 3-unit element set c[0] to c[2] of the unit data length UL=3.

The elements c[0] to c[2], as indicated by expressions (14) to (16) below, are expressed by floating decimal point values having the significand value f and the exponent value e.

$$c[0]=(f0,e0) \qquad (14)$$

$$c[1]=(f1,e1) \qquad (15)$$

$$c[2]=(f2,e2) \qquad (16)$$

In this case, the UL 3-unit data shift count generating circuit 1403-1, for example, uses expression (17) below, and identifies the exponent value s_max, which is greatest among the input exponent value e0 to e2 of the elements c[0] to c[2].

$$s\_max=\max(e0,e1,e2) \qquad (17)$$

The UL 3-unit data shift count generating circuit 1403-1 determines as the element set shift count s, and outputs the identified exponent value s_max. Further, the UL 3-unit data shift count generating circuit 1403-1, for example, uses expression (18) to (20) below; calculates the exponent values s0 to s2 of the elements c[0] to c[2] by subtracting the exponent values e0 to e2 of the elements c[0] to c[2] from the exponent value s_max; and outputs the exponent values s0 to s2 of the elements c[0] to c[2] to the shifter 1302.

$$s0=s\_max-e0 \qquad (18)$$

$$s1=s\_max-e1 \qquad (19)$$

$$s2=s\_max-e2 \qquad (20)$$

Thus, even when the elements c[0] to c[2] are expressed as floating decimal point values, a suitable element set shift count s (s_max) and suitable exponent values s0 to s2 of the elements c[0] to c[2] can be output. In this case, the shifter 1302 converts the significand values f0 to f2 of the elements c[0] to c[2] into the significand values c'[0] to c'[2] of each element according to the input exponent values s0 to s2.

In the description above, although the UL 3-unit data shift count generating circuit 1403-1 in the shift count generating circuit 1301 has been described as an example, the other UL n-unit data shift count generating circuits (see FIGS. 14 and 15) perform similar operation.

According to the data processing apparatus 100 of the fourth example, even when the elements c[0] to c[15] are expressed as floating decimal point values, the element set shift count s that is the unit data length UL and the exponent values s0 to s15 of the elements c[0] to c[15] can be output. Thus, even when each element included in a series of elements is expressed as a floating decimal point value, normalization processing can be performed with respect to data unit blocks that correspond to the unit data length UL.

The data processing method described in the present embodiment may be implemented by executing a prepared program on a computer such as a personal computer and a workstation. The program is stored on a non-transitory, computer-readable recording medium such as a hard disk, a flexible disk, a CD-ROM, an MO, and a DVD, read out from the computer-readable medium, and executed by the computer. The program may be distributed through a network such as the Internet.

The data processing apparatus 100 described in the present embodiment can be realized by an application specific integrated circuit (ASIC) such as a standard cell or a structured ASIC, or a programmable logic device (PLD) such as a field-programmable gate array (FPGA). Specifically, for example, functional units are defined in hardware description language (HDL), which is logically synthesized and applied to the ASIC, the PLD, etc., thereby enabling manufacture of the data processing apparatus 100.

The embodiments enable increases in circuit scale to be suppressed while enhancing calculation accuracy.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data processing apparatus comprising:
   a computing circuit that performs a matrix computation between data streams whose unit data is of a matrix format;
   a determining unit that: for each matrix obtained by the matrix computation by the computing unit, determines based on the value of each element included in the matrix, an exponent value for expressing each element included in the matrix as a floating decimal point value, by obtaining one or more element sets, each having a corresponding element count and each being a series of elements obtained by the matrix computation by the computing circuit, and determining based on the value of each element included in the element set, an exponent value for the element set to express elements of the element set as floating decimal point values, the element count being a unit data length, the unit data length corresponding to an instruction and being a length of a unit of the matrix;
   wherein the determining unit includes:
   a determining circuit that, with respect to each element set having a corresponding element count where a total count of elements included in a series of elements is an upper limit, determines from the head of the series of elements and for each element set and based on the value of each element included in the element set, the exponent value for the element set to express each element of the element set as a floating decimal point value; and
   a selecting circuit that, with respect to each element included in the series of elements, selects from among the exponent values determined for each element set by the determining circuit, the exponent value for the element set;
   a converting unit that converts the value of each element included in the series of elements into a significand value of the element, according to the exponent value determined by the determining unit; and
   wherein the converting unit includes a shifting circuit that, for each element included in the series of elements, converts the value of the element into the significand of the element according to the exponent value selected for the element set by the selecting circuit; and
   an output circuit that:
   correlates and outputs the exponent value and each matrix after conversion in which the value of each element in the matrix has been converted by the converting unit; and
   correlates and outputs the exponent value determined for each element set by the determiner and the value of each element included in the element set after conversion by the converter.

2. The data processing apparatus according to claim 1, wherein the determining unit determines as the exponent value for each matrix, the exponent value for expressing, as a floating decimal point value, the element whose absolute value is greatest among the elements included in the matrix.

3. The data processing apparatus according to claim 1, wherein
   the stream data includes an array of the matrices after the conversion in which the value of each element has been converted by the converting unit and an array of the exponent values determined for each matrix by the determining unit, and
   the computing circuit, when performing a matrix addition computation between the data streams, performs the matrix addition computation between the data streams by shifting the value of each element included in any one among first and second matrices corresponding to the data streams, based on a difference of first and second exponent values corresponding to the data streams.

4. The data processing apparatus according to claim 3, wherein the computing circuit, based on a value obtained by subtracting the first exponent value from the second exponent value, shifts the first matrix when the obtained value is positive and shifts the second matrix, based on the value when the obtained value is negative.

5. The data processing apparatus according to claim 1, wherein the converting unit includes the shifting circuit that, for each element set of the element count that is the unit data length and when among a first mode and a second mode, the first mode has been selected, converts the value of each element included in the element set into a significand value of the element according to the exponent value determined for the element set by the determining unit, and when the second mode has been selected, converts the value of each element included in the series of elements into a significand of the element according to an exponent value input for the series of elements.

6. The data processing apparatus according to claim 1, wherein
the determining unit, from the head of the series of elements and for each element set of the element count that is the unit data length, determines as the exponent value for the element set, the exponent value that is greatest among the exponent values of the elements included in the element set, when each of the elements included in the series of elements is expressed as a floating decimal point value, and
the converting unit, for each element set, converts the significand value of each element included in the element set into the significand of each element, according to a conversion exponent value calculated by subtracting the exponent value of the element from the greatest exponent value.

7. The data processing apparatus according to claim 1, wherein the element count is a power of the number two.

8. A data processing method that is executed by a computer, the data processing method comprising:
performing a matrix computation by a computing circuit between data streams whose unit data is of a matrix format;
determining for each matrix obtained by the matrix computation by the computing circuit and based on the value of each element included in the matrix, an exponent value for expressing each element included in the matrix as a floating decimal point value, by obtaining one or more element sets, each having a corresponding element count and each being a series of elements obtained by the matrix computation by the computing circuit, and determining based on the value of each element included in the element set, an exponent value for the element set to express elements of the element set as floating decimal point values, the element count being a unit data length, the unit data length corresponding to an instruction and being a length of a unit of the matrix;
wherein the step of determining includes:
with respect to each element set having a corresponding element count where a total count of elements included in a series of elements is an upper limit, determining by a determining circuit from the head of the series of elements and for each element set and based on the value of each element included in the element set, the exponent value for the element set to express each element of the element set as a floating decimal point value; and
with respect to each element included in the series of elements, selecting by a selecting circuit from among the exponent values determined for each element set, the exponent value for the element set;
converting the value of each element included in the series of elements into a significand value of the element, according to the exponent value determined at the determining, wherein the step of converting includes, for each element included in the series of elements, converting by a shifting circuit the value of the element into the significand of the element according to the exponent value selected for the element set by the selecting circuit; and
correlating and outputting the exponent value and each matrix after conversion in which the value of each element in the matrix has been converted at the converting; and
correlating and outputting the exponent value determined for each element set and the value of each element included in the element set after conversion.

9. The data processing method according to claim 8, wherein the element count is a power of the number two.

10. A non-transitory, computer-readable recording medium that stores a data processing program that causes a computer to execute a process comprising:
performing a matrix computation by a computing circuit between data streams whose unit data is of a matrix format;
determining for each matrix obtained by the matrix computation by the computing circuit and based on the value of each element included in the matrix, an exponent value for expressing each element included in the matrix as a floating decimal point value, by obtaining one or more element sets, each having a corresponding element count and each being a series of elements obtained by the matrix computation by the computing circuit, and determining based on the value of each element included in the element set, an exponent value for the element set to express elements of the element set as floating decimal point values, the element count being a unit data length, the unit data length corresponding to an instruction and being a length of a unit of the matrix;
wherein the step of determining includes:
with respect to each element set having a corresponding element count where a total count of elements included in a series of elements is an upper limit, determining by a determining circuit from the head of the series of elements and for each element set and based on the value of each element included in the element set, the exponent value for the element set to express each element of the element set as a floating decimal point value; and
with respect to each element included in the series of elements, selecting by a selecting circuit from among the exponent values determined for each element set by the determining circuit, the exponent value for the element set;
converting the value of each element included in the series of elements into a significand value of the element, according to the exponent value determined at the determining, wherein the step of converting includes, for each element included in the series of elements, converting by a shifting circuit the value of the element into the significand of the element according to the exponent value selected for the element set by the selecting circuit; and
correlating and outputting the exponent value and each matrix after conversion in which the value of each element in the matrix has been converted at the converting; and
correlating and outputting the exponent value determined for each element set and the value of each element included in the element set after conversion.

11. The non-transitory, computer-readable recording medium according to claim 10, wherein the element count is a power of the number two.

\* \* \* \* \*